(12) United States Patent
Li et al.

(10) Patent No.: US 11,644,519 B2
(45) Date of Patent: May 9, 2023

(54) IMAGING SYSTEM AND CONTROL METHOD THEREOF

(71) Applicant: SHANGHAI UNITED IMAGING HEALTHCARE CO., LTD., Shanghai (CN)

(72) Inventors: Bo Li, Shanghai (CN); Xiangyu Ma, Shanghai (CN)

(73) Assignee: SHANGHAI UNITED IMAGING HEALTHCARE CO., LTD., Shanghai (CN)

(*) Notice: Subject to any disclaimer, the term of this patent is extended or adjusted under 35 U.S.C. 154(b) by 76 days.

(21) Appl. No.: 17/213,153

(22) Filed: Mar. 25, 2021

(65) Prior Publication Data

US 2022/0120834 A1 Apr. 21, 2022

(30) Foreign Application Priority Data

Oct. 19, 2020 (CN) .......................... 202022328314.8

(51) Int. Cl.
*G01R 33/42* (2006.01)
*G01R 33/30* (2006.01)

(52) U.S. Cl.
CPC ............. *G01R 33/42* (2013.01); *G01R 33/30* (2013.01)

(58) Field of Classification Search
CPC ........ G31R 33/42; G61R 33/30; A61B 5/704; A61B 5/055
See application file for complete search history.

(56) References Cited

U.S. PATENT DOCUMENTS

| | | | | |
|---|---|---|---|---|
| 2006/0055402 | A1* | 3/2006 | Seki | A61B 5/061 324/262 |
| 2012/0265050 | A1* | 10/2012 | Wang | A61B 6/485 600/407 |
| 2013/0229181 | A1* | 9/2013 | Biber | G01R 33/42 324/318 |
| 2014/0000630 | A1* | 1/2014 | Ford | A61B 5/0042 128/845 |

\* cited by examiner

*Primary Examiner* — Boniface Ngathi N
(74) *Attorney, Agent, or Firm* — Metis IP LLC

(57) ABSTRACT

The present disclosure relates to systems and methods for shielding electromagnetic waves. The system may include an imaging device, a shielding layer assembly disposed on at least a first portion of the imaging device, and a shielding cover assembly disposed on at least a second portion of the imaging device. When the shielding cover assembly is coupled to the shielding layer assembly, the shielding cover assembly and the shielding layer assembly may be combined to form a shielding space that is shielded against electromagnetic waves from an outside of the shielding space.

18 Claims, 20 Drawing Sheets

516

IMAGING SYSTEM AND CONTROL METHOD THEREOF

CROSS-REFERENCE TO RELATED APPLICATIONS

This application claims priority of Chinese Patent Application No. 202022328314.8 filed on Oct. 19, 2020, the contents of which are incorporated herein by reference in their entirety.

TECHNICAL FIELD

The present disclosure generally relates to imaging technology, and in particular, to a shielding system of an imaging device and a control method thereof.

BACKGROUND

Magnetic resonance imaging (MRI) is an imaging technology utilizing resonance characteristics of a subject's magnetic nucleus in a magnetic field. During an MRI process, hydrogen atoms within a target region of the subject may oscillate at their characteristic Larmor frequency under a uniform main magnetic field (e.g., a B0 field), and generate a magnetic resonance phenomenon under an excitation of a radio frequency field (e.g., a B1 field). Further, a gradient field may be used to encode spatial information into MR signals related to the target region of the subject being imaged. The MR signals may be received and processed to generate an MR image. Because MRI introduces no ionizing radiation or damage to the subject, has a relatively high resolution, a relatively high contrast, and multiple parameters, and is capable of performing a cross-sectional imaging of the subject from any orientation, it has been widely used in medical imaging field.

During a scanning process of an MRI device, electrical and electronic devices (e.g., a telephone, a transformer, etc.) around the MRI device may interfere with the MR signals and affect the imaging quality of the MRI device. Therefore, it is desirable to provide effective systems and methods for reducing or shielding an electromagnetic interference (EMI) disturbing the MRI device.

SUMMARY

An aspect of the present disclosure relates to a system. The system may include an imaging device, a shielding layer assembly disposed on at least a first portion of the imaging device, and a shielding cover assembly disposed on at least a second portion of the imaging device. When the shielding cover assembly is coupled to the shielding layer assembly, the shielding cover assembly and the shielding layer assembly may be combined to form a shielding space that is shielded against electromagnetic waves from an outside of the shielding space.

In some embodiments, the first portion of the imaging device may include a scanner, and the shielding layer assembly may include a first shielding layer disposed on the scanner.

In some embodiments, the first shielding layer may be disposed on a shell of the scanner.

In some embodiments, the scanner may include a cavity, and the first shielding layer may be disposed on at least a portion of a peripheral surface of the cavity.

In some embodiments, the scanner may include a radio frequency coil component, a gradient coil component, and a main magnet component, and the first shielding layer may be disposed on at least a portion of the main magnet component.

In some embodiments, the second portion of the imaging device may include a supporting component configured to support a table, and the shielding layer assembly may include a second shielding layer disposed on at least a portion of the supporting component.

In some embodiments, the scanner may include a first surface and a second surface disposed opposite to each other in an axial direction of the scanner, and the supporting component may include a first supporting unit disposed on a side of the first surface and/or a second supporting unit disposed on a side of the second surface of the scanner.

In some embodiments, the second shielding layer may include a first portion of the second shielding layer including a first shielding layer unit disposed on at least a portion of the first supporting unit, and/or a second portion of the second shielding layer including a second shielding layer unit disposed on at least a portion of the second supporting unit.

In some embodiments, the shielding cover assembly may include a first shielding cover coupled to the first shielding layer and at least a first portion of the second shielding layer.

In some embodiments, the shielding cover assembly may further include a second shielding cover coupled to the first shielding layer and at least a second portion of the second shielding layer.

In some embodiments, the first shielding cover and/or the second shielding cover may moveable or detachable.

In some embodiments, the supporting component may include a guide unit, and the second shielding cover may be slidable along the guide unit in an axial direction of the scanner.

In some embodiments, the system may further include a driving component configured to drive the second shielding cover to slide along the guide unit in the axial direction of the scanner.

In some embodiments, the system may further include a rocker assembly operable to control a movement of the second shielding cover. One end of the rocker assembly may be coupled to the second shielding cover and another end of the rocker assembly may be coupled to the supporting component.

In some embodiments, the second shielding cover may be slidable along a direction perpendicular to an axial direction of the scanner.

In some embodiments, the first shielding cover and/or the second shielding cover may include a rotatable structure.

In some embodiments, at least a portion of the second shielding cover may be coupled to the supporting component via a hinged connection.

In some embodiments, the shielding layer assembly and/or the shielding cover assembly may include a mesh structure.

Another aspect of the present disclosure relates to a method implemented on a computing device having one or more processors and one or more storage devices. The method may include determining a current position for at least one portion of a shielding cover assembly of an imaging device. The imaging device may include a shielding layer assembly disposed on at least a portion of the imaging device. The method may further include causing a driving device to drive the at least one portion of the shielding cover assembly to move from the current position to a target position. When the at least one portion of the shielding cover assembly moves to the target position, the shielding cover assembly may be coupled to the shielding layer assembly to form a shielding space that is shielded against electromagnetic waves from an outside of the shielding space.

In some embodiments, the causing a driving device to drive the at least one portion of the shielding cover assembly to move from the current position to a target position may include determining an operating state of the imaging device, and causing a driving device to drive the at least one portion of the shielding cover assembly to move from the current position to the target position based at least in part on the operating state.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein.

DETAILED DESCRIPTION

Figure 1:
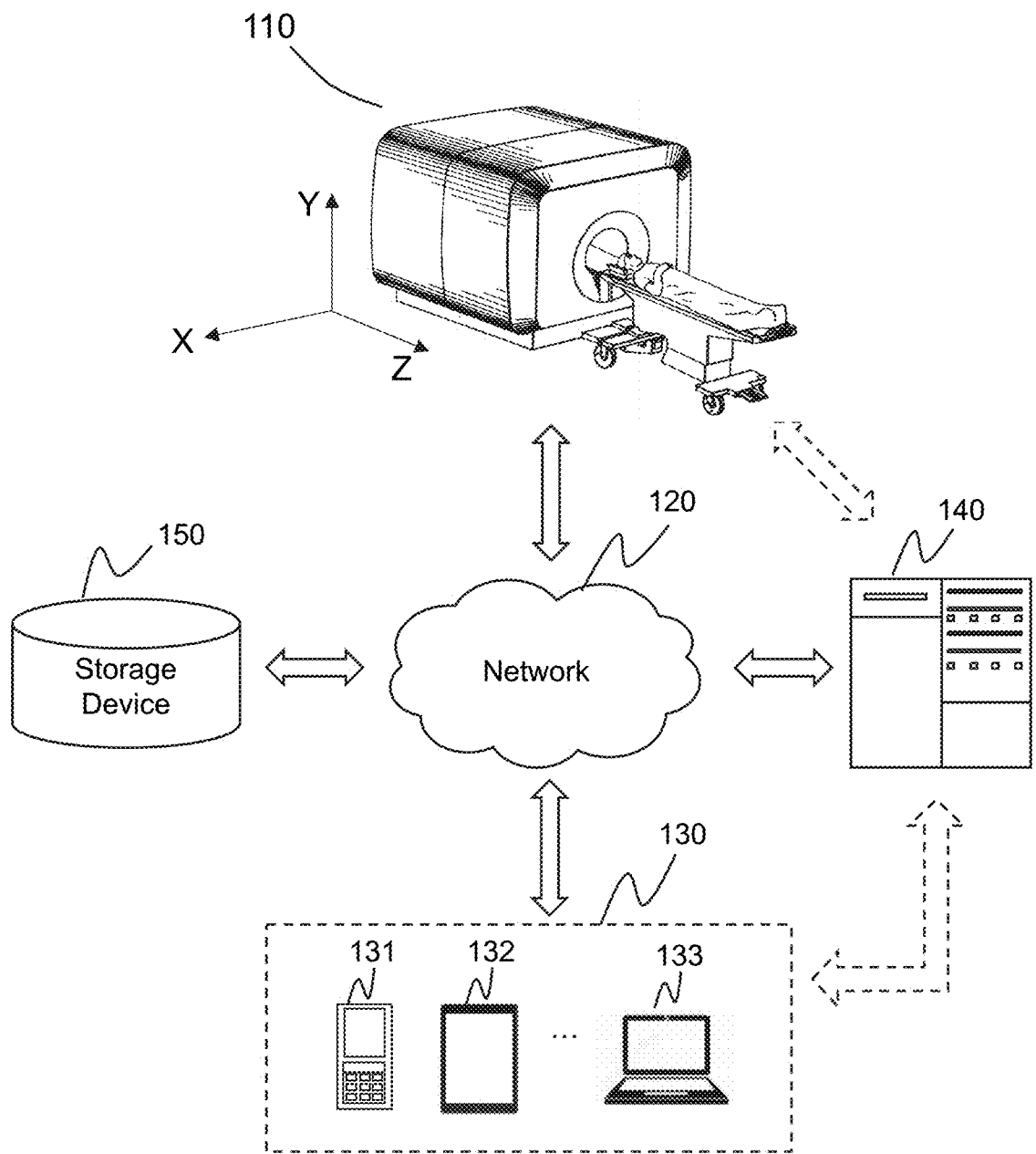
FIG. 1 is a schematic diagram illustrating an exemplary imaging system according to some embodiments of the present disclosure.

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is to describe particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "engine," "unit," "module," and/or "block" used herein are one method to distinguish different components, elements, parts, section or assembly of different level in ascending order. However, the terms may be displaced by another expression if they achieve the same purpose.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for execution on computing devices (e.g., the processor 210 illustrated in FIG. 2 and/or the CPU 330 illustrated in FIG. 3) may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an EPROM. It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks but may be represented in hardware or firmware. In general, the modules/units/blocks described herein refer to logical modules/units/blocks that may be combined with other modules/units/blocks or divided into sub-modules/sub-units/sub-blocks despite their physical organization or storage. The description may apply to a system, an engine, or a portion thereof.

It will be understood that, although the terms "first," "second," "third," etc., may be used herein to describe various elements, these elements should not be limited by these terms. These terms are only used to distinguish one element from another. For example, a first element could be termed a second element, and, similarly, a second element could be termed a first element, without departing from the scope of exemplary embodiments of the present disclosure.

It will be understood that when a unit, engine, module or block is referred to as being "on," "connected to," or "coupled to," another unit, engine, module, or block, it may be directly on, connected or coupled to, or communicate with the other unit, engine, module, or block, or an intervening unit, engine, module, or block may be present, unless the context clearly indicates otherwise. As used herein, the term "and/or" includes any and all combinations of one or more of the associated listed items.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

The flowcharts used in the present disclosure illustrate operations that systems implement according to some embodiments of the present disclosure. It is to be expressly understood, the operations of the flowcharts may be implemented not in order. Conversely, the operations may be implemented in inverted order, or simultaneously. Moreover, one or more other operations may be added to the flowcharts. One or more operations may be removed from the flowcharts.

Provided herein are systems and components for medical imaging and/or medical treatment. In some embodiments, the medical system may include an imaging system. The imaging system may include a single modality imaging system and/or a multi-modality imaging system. The single modality imaging system may include, for example, a magnetic resonance imaging (MRI) system. Exemplary MRI systems may include a superconducting magnetic resonance imaging system, a non-superconducting magnetic resonance imaging system, etc. The multi-modality imaging system may include, for example, a computed tomography-magnetic resonance imaging (MRI-CT) system, a positron emission tomography-magnetic resonance imaging (PET-MRI) system, a single photon emission computed tomography-magnetic resonance imaging (SPECT-MRI) system, a digital subtraction angiography-magnetic resonance imaging (DSA-MRI) system, etc. In some embodiments, the medical system may include a treatment system. The treatment system may include a treatment plan system (TPS), image-guide radiotherapy (IGRT), etc. The image-guide radiotherapy (IGRT) may include a treatment device and an imaging device. The treatment device may include a linear accelerator, a cyclotron, a synchrotron, etc., configured to perform a radio therapy on a subject. The treatment device may include an accelerator of species of particles including, for example, photons, electrons, protons, or heavy ions. The imaging device may include an MRI scanner, a CT scanner (e.g., cone beam computed tomography (CBCT) scanner), a digital radiology (DR) scanner, an electronic portal imaging device (EPID), etc.

An aspect of the present disclosure relates to a system including an imaging device (e.g., an MRI device), a shielding layer assembly, and a shielding cover assembly. The shielding layer assembly may be disposed on at least a first portion of the imaging device. The shielding cover assembly may be disposed on at least a second portion of the imaging device. When the shielding cover assembly is coupled to the shielding layer assembly, the shielding cover assembly and the shielding layer assembly may shield the imaging device from an EMI. Another aspect of the present disclosure relates to a method. The method may include determining a target position for at least one portion of the shielding cover assembly, and causing a driving device to drive the at least one portion of the shielding cover assembly to move to the target position. When the at least one portion of the shielding cover assembly moves to the target position, the shielding cover assembly may be coupled to the shielding layer assembly to shield the imaging device from an EMI. According to the system and method of the present disclosure, a shielding layer assembly and/or a shielding cover assembly may be used to shield the imaging device from the EMI, thereby improving the imaging quality of the imaging device.

FIG. 1 is a schematic diagram illustrating an exemplary imaging system 100 according to some embodiments of the present disclosure. As illustrated, the imaging system 100 may include a scanner 110 (e.g., an MRI scanner), a network 120, a terminal device 130, a processing device 140, and a storage device 150. The components of the imaging system 100 may be connected in one or more of various ways. Mere by way of example, as illustrated in FIG. 1, the scanner 110 may be connected to the processing device 140 through the network 120. As another example, the scanner 110 may be connected to the processing device 140 directly (as indicated by the bi-directional arrow in dotted lines linking the scanner 110 and the processing device 140). As a further example, the storage device 150 may be connected to the processing device 140 directly or through the network 120. As a further example, the terminal device 130 may be connected to the processing device 140 directly (as indicated by the bi-directional arrow in dotted lines linking the terminal device 130 and the processing device 140) or through the network 120.

The scanner 110 may scan a subject located within its detection region and generate data relating to the subject. In some embodiments, the subject may include a patient, a man-made object, etc. In some embodiments, the subject may include a specific portion, organ, and/or tissue of a patient. For example, the subject may include a head, a brain, a neck, a body, a shoulder, an arm, a thorax, a cardiac, a stomach, a blood vessel, a soft tissue, a knee, feet, or the like, or any combination thereof. In some embodiments, the scanner 110 may be a close-bore scanner or an open-bore scanner. In the present disclosure, the X axis, the Y axis, and the Z axis shown in FIG. 1 may form an orthogonal coordinate system. The X axis and the Z axis shown in FIG. 1 may be horizontal and the Y axis may be vertical. As illustrated, the positive X direction along the X axis may be from the right side to the left side of the scanner 110 seen from the direction facing the front of the scanner 110, the positive Y direction along the Y axis may be from the lower part to the upper part of the scanner 110, the positive Z direction along the Z axis may refer to a direction in which the subject is moved out of the scanning channel (or referred to as a bore or cavity) of the scanner 110.

The scanner 110 may include a main magnet component for providing a strong uniform main magnetic field to align the individual magnetic moments of H atoms within the subject's body (e.g., a tissue in the subject's body). During this process, the H atoms may oscillate around their magnetic poles at their characteristic Larmor frequency. If the tissue is subjected to an additional magnetic field, which is tuned to the Larmor frequency, the H atoms may absorb additional energy, which rotates the net aligned moment of the H atoms. The additional magnetic field may be provided by a radio frequency (RF) excitation signal generated by an RF coil component of the scanner 110. When the additional magnetic field is removed, the magnetic moments of the H atoms may rotate back into alignment with the main magnetic field thereby emitting an MR signal. The MR signal may be received and processed to generate an MR image.

In some embodiments, an external device (e.g., a telephone, a transformer, etc.) may generate electromagnetic waves that interfere with waveforms/signals (e.g., waveforms generated by the main magnet component, RF waveforms generated by the RF coils) generated in the scanner 110. The electromagnetic waves may affect the stability and/or homogeneity of the magnetic fields (e.g., the main magnetic field, the additional magnetic field), thereby disturbing the operation of the scanner 110. In some embodiments, the scanner 110 may be placed in a specially designed scanning room. The scanner 110 may be shielded from the EMI in the scanning room. For example, the walls, floor, and ceiling of the scanning room may include electromagnetic shielding materials to form a Faraday cage to achieve electromagnetic shielding. In some embodiments, the imaging system 100 may include a shielding layer assembly and/or a shielding cover assembly coupled to the scanner 110. The shielding layer assembly may be disposed on at least a first portion of the scanner 110. The shielding cover assembly may be disposed on at least a second portion of the scanner 110. The shielding cover assembly may be operably coupled to the shielding layer assembly. When the shielding cover assembly is coupled to the shielding layer assembly, the shielding cover assembly and the shielding layer assembly may form a Faraday cage and/or shield the scanner 110 from the EMI. More description of the shielding cover assembly and the shielding layer assembly may be found elsewhere in the present disclosure (e.g., FIG. 4 and the descriptions thereof).

The network 120 may include any suitable network that can facilitate the exchange of information and/or data for the imaging system 100. In some embodiments, one or more components of the imaging system 100 (e.g., the scanner 110, the terminal device 130, the processing device 140, the storage device 150) may communicate with one or more other components of the imaging system 100 via the network 120. For example, the processing device 140 may obtain imaging data from the scanner 110 via the network 120. As another example, the processing device 140 may cause a controller (not shown) of the imaging system 100 to control a movement of at least one portion of the shielding cover assembly (e.g., a first shielding cover or a second shielding cover) via the network 120. In some embodiments, the network 120 may be any type of wired or wireless network, or a combination thereof. The network 120 may be and/or include a public network (e.g., the Internet), a private network (e.g., a local area network (LAN), a wide area network (WAN)), etc.), a wired network (e.g., an Ethernet network), a wireless network (e.g., an 802.11 network, a Wi-Fi network, etc.), a cellular network (e.g., a Long Term Evolution (LTE) network), a frame relay network, a virtual private network ("VPN"), a satellite network, a telephone network, routers, hubs, switches, server computers, and/or any combination thereof. Merely by way of example, the network 120 may include a cable network, a wireline network, a fiber-optic network, a telecommunications network, an intranet, a wireless local area network (WLAN), a metropolitan area network (MAN), a public telephone switched network (PSTN), a Bluetooth™ network, a ZigBee™ network, a near field communication (NFC) network, or the like, or any combination thereof. In some embodiments, the network 120 may include one or more network access points. For example, the network 120 may include wired and/or wireless network access points such as base stations and/or internet exchange points through which one or more components of the imaging system 100 may be connected to the network 120 to exchange data and/or information.

The terminal device 130 may include a mobile device 131, a tablet computer 132, a laptop computer 133, or the like, or any combination thereof. In some embodiments, the mobile device 131 may include a smart home device, a wearable device, a smart mobile device, a virtual reality device, an augmented reality device, or the like, or any combination thereof. In some embodiments, the smart home device may include a smart lighting device, a control device of an intelligent electrical apparatus, a smart monitoring device, a smart television, a smart video camera, an interphone, or the like, or any combination thereof. In some embodiments, the wearable device may include a smart bracelet, smart footgear, a pair of smart glasses, a smart helmet, a smart watch, smart clothing, a smart backpack, a smart accessory, or the like, or any combination thereof. In some embodiments, the smart mobile device may include a smartphone, a personal digital assistant (PDA), a gaming device, a navigation device, a point of sale (POS) device, or the like, or any combination thereof. In some embodiments, the virtual reality device and/or the augmented reality device may include a virtual reality helmet, a virtual reality glass, a virtual reality patch, an augmented reality helmet, an augmented reality glass, an augmented reality patch, or the like, or any combination thereof. For example, the virtual reality device and/or the augmented reality device may include a Google™ Glass, an Oculus Rift, a Hololens, a Gear VR, etc. In some embodiments, the scanner 110 and/or the processing device 140 may be remotely operated through the terminal device 130. In some embodiments, the scanner 110 and/or the processing device 140 may be operated through the terminal device 130 via a wireless connection. In some embodiments, the terminal device 130 may receive information and/or instructions inputted by a user, and send the received information and/or instructions to the scanner 110 or the processing device 140 via the network 120. In some embodiments, the terminal device 130 may receive data and/or information from the processing device 140. In some embodiments, the terminal device 130 may be part of the processing device 140. In some embodiments, the terminal device 130 may be omitted.

The processing device 140 may process data and/or information obtained from the scanner 110, the terminal device 130, and/or the storage device 150. For example, the processing device 140 may obtain mechanical parameters from the scanner 110 and determine an operating state of the scanner 110 based on the mechanical parameters. Further, the processing device 140 may determine a target position for at least one portion of the shielding cover assembly and cause a driving device to drive the at least one portion of the shielding cover assembly to move to the target position. In some embodiments, the processing device 140 may be a single server or a server group. The server group may be centralized or distributed. In some embodiments, the processing device 140 may be local or remote. For example, the processing device 140 may access information and/or data stored in or acquired by the scanner 110, the terminal device 130, and/or the storage device 150 via the network 120. As another example, the processing device 140 may be directly connected to the scanner 110 (as illustrated by the bidirectional arrow in dashed lines connecting the processing device 140 and the scanner 110 in FIG. 1), the terminal device 130 (as illustrated by the bidirectional arrow in dashed lines connecting the processing device 140 and the terminal device 130 in FIG. 1), and/or the storage device 150 to access stored or acquired information and/or data. In some embodiments, the processing device 140 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof. In some embodiments, the processing device 140 may be implemented on a computing device 200 having one or more components illustrated in FIG. 2 in the present disclosure.

The storage device 150 may store data and/or instructions. In some embodiments, the storage device 150 may store data obtained from the scanner 110, the terminal device 130, and/or the processing device 140. For example, the storage device 150 may store imaging sequences used by the scanner 110 for imaging a subject. As another example, the storage device 150 may store instructions that the processing device 140 may execute to control a movement of the at least one portion of the shielding cover assembly. In some embodiments, the storage device 150 may store data and/or instructions that the processing device 140 may execute or use to perform exemplary methods described in the present disclosure. For example, the storage device 150 may store instructions that the processing device 140 may execute to reconstruct a magnetic resonance image. In some embodiments, the storage device 150 may include a mass storage device, a removable storage device, a volatile read-and-write memory, a read-only memory (ROM), or the like, or any combination thereof. Exemplary mass storage may include a magnetic disk, an optical disk, a solid-state drive, etc. Exemplary removable storage may include a flash drive, a floppy disk, an optical disk, a memory card, a zip disk, a magnetic tape, etc. Exemplary volatile read-and-write memory may include a random access memory (RAM). Exemplary RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. Exemplary ROM may include a mask ROM (MROM), a programmable ROM (PROM), an erasable programmable ROM (PEROM), an electrically erasable programmable ROM (EEPROM), a compact disk ROM (CD-ROM), and a digital versatile disk ROM, etc. In some embodiments, the storage device 150 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

In some embodiments, the storage device 150 may be connected to the network 120 to communicate with one or more components (e.g., the scanner 110, the processing device 140, the terminal device 130) of the imaging system 100. One or more components of the imaging system 100 may access the data or instructions stored in the storage device 150 via the network 120. In some embodiments, the storage device 150 may be directly connected to or communicate with one or more components (e.g., the scanner 110, the processing device 140, the terminal device 130) of the imaging system 100. In some embodiments, the storage device 150 may be part of the processing device 140.

In some embodiments, the imaging system 100 may further include one or more power supplies (not shown in FIG. 1) connected to one or more components (e.g., the scanner 110, the processing device 140, the terminal device 130, the storage device 150) of the imaging system 100.

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure.

Figure 2:
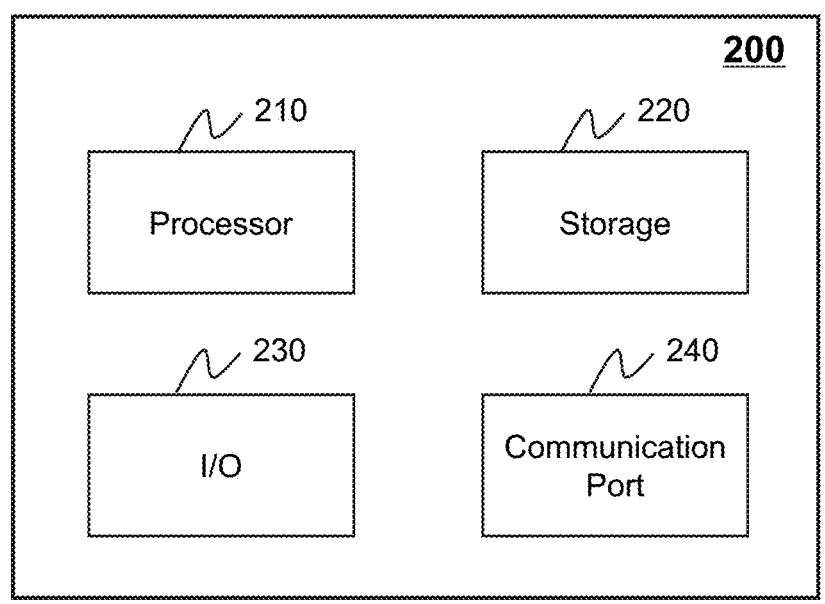
FIG. 2 is a schematic diagram illustrating exemplary hardware and/or software components of an exemplary computing device according to some embodiments of the present disclosure.

FIG. 2 is a schematic diagram illustrating exemplary hardware and/or software components of an exemplary computing device according to some embodiments of the present disclosure. In some embodiments, the processing device 140 may be implemented on the computing device 130. As illustrated in FIG. 2, the computing device 200 may include a processor 210, a storage 220, an input/output (I/O) 230, and a communication port 240.

The processor 210 may execute computer instructions (program code) and perform functions of the processing device 140 in accordance with techniques described herein. The computer instructions may include routines, programs, objects, components, signals, data structures, procedures, modules, and functions, which perform particular functions described herein. In some embodiments, the processor 210 may include a microcontroller, a microprocessor, a reduced instruction set computer (RISC), an application specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field programmable gate array (FPGA), an advanced RISC machine (ARM), a programmable logic device (PLD), any circuit or processor capable of executing one or more functions, or the like, or any combinations thereof.

Merely for illustration purposes, only one processor is described in the computing device 200. However, it should be noted that the computing device 200 in the present disclosure may also include multiple processors, and thus operations of a method that are performed by one processor as described in the present disclosure may also be jointly or separately performed by the multiple processors. For example, if in the present disclosure the processor of the computing device 200 executes both operations A and B, it should be understood that operations A and step B may also be performed by two different processors jointly or separately in the computing device 200 (e.g., a first processor executes operation A and a second processor executes operation B, or the first and second processors jointly execute operations A and B).

Merely by way example, the processor 210 may receive instructions to follow an MRI scan protocol for imaging/scanning the subject. For example, the processor 210 may instruct a subject positioning system of the scanner 110 to move the subject to a proper position within the main magnet. As another example, the processor 210 may also provide certain control signals to control the main magnet to generate a main magnet field with a specific strength.

The processor 210 may receive control signals to set the shape, amplitude, and/or timing of gradient waveforms generated by gradient coils in the scanner 110 and/or the RF waveforms generated by the RF coils, and send the set parameters to a waveform generator to instruct the waveform generator to generate a particular gradient waveform sequence and pulse sequence that are to be applied to the gradient coils and the RF coils through one or more amplifiers, respectively.

The processor 210 may also sample data (e.g., echoes) from the RF coils based on one or more sampling parameters including, for example, timing information (e.g., the length of data acquisition), the type of k-space data acquisition (e.g., undersampling, oversampling), sampling trajectory (e.g., Cartesian trajectory, non-Cartesian trajectory such as spiral trajectory, radial trajectory), or the like, or a combination thereof. In some embodiments, the timing information may be input by a user (e.g., an operator) or autonomously determined by the imaging system 100 based on one or more other parameters (e.g., clinical needs) of an imaging process. The timing information may correspond to the type of the gradient and RF waveforms that are sent to the gradient coils and the RF coils, respectively, so that the MR signals may be correctly sampled. The processor 210 may also generate an MR image by reconstructing the sampled data.

The storage 220 may store data/information obtained from the scanner 110, the terminal device 130, the storage device 150, or any other component of the imaging system 100. In some embodiments, the storage 220 may include a mass storage device, a removable storage device, a volatile read-and-write memory, a read-only memory (ROM), or the like, or any combination thereof. For example, the mass storage device may include a magnetic disk, an optical disk, a solid-state drive, etc. The removable storage device may include a flash drive, a floppy disk, an optical disk, a memory card, a zip disk, a magnetic tape, etc. The volatile read-and-write memory may include a random access memory (RAM). The RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. The ROM may include a mask ROM (MROM), a programmable ROM (PROM), an erasable programmable ROM (PEROM), an electrically erasable programmable ROM (EEPROM), a compact disk ROM (CD-ROM), and a digital versatile disk ROM, etc. In some embodiments, the storage 220 may store one or more programs and/or instructions to perform exemplary methods described in the present disclosure. For example, the storage 220 may store a program for the processing device 140 to execute to control a movement of the at least one portion of the shielding cover assembly.

The I/O 230 may input or output signals, data, or information. In some embodiments, the I/O 230 may enable user interaction with the processing device 140. In some embodiments, the I/O 230 may include an input device and an output device. Exemplary input devices may include a keyboard, a mouse, a touch screen, a microphone, a trackball, or the like, or a combination thereof. Exemplary output devices may include a display device, a loudspeaker, a printer, a projector, or the like, or a combination thereof. Exemplary display devices may include a liquid crystal display (LCD), a light-emitting diode (LED)-based display, a flat panel display, a curved screen, a television device, a cathode ray tube (CRT), or the like, or a combination thereof.

Merely by way of example, a user (e.g., an operator) may input data related to a subject (e.g., a patient) that is being/to be imaged/scanned through the I/O 230. The data related to the subject may include identification information (e.g., a name, an age, a gender, a medical history, contract information, a physical examination result) and/or the test information including the nature of the MRI scan that must be performed. The user may also input parameters needed for the operation of the scanner 110, such as an imaging sequence, image contrast and/or ratio, a region of interest (ROI), slice thickness, an imaging type (e.g., T1 weighted imaging, T2 weighted imaging, proton density weighted imaging), T1, T2, an echo type (spin echo, fast spin echo (FSE), fast recovery FSE, single shot FSE, gradient recalled echo, fast imaging with steady-state procession), a flip angle value, acquisition time (TA), echo time (TE), repetition time (TR), echo train length (ETL), the number of phases, the number of excitations (NEX), inversion time, bandwidth (e.g., RF receiver bandwidth, RF transmitter bandwidth), a scan type, a type of sampling, or the like, or any combination thereof. The I/O may also display MR images generated based on the sampled data.

The communication port 240 may be connected to a network (e.g., the network 120) to facilitate data communications. The communication port 240 may establish connections between the processing device 140 and the scanner 110, the terminal device 130, or the storage device 150. The connection may be a wired connection, a wireless connection, or a combination of both that enables data transmission and reception. The wired connection may include an electrical cable, an optical cable, a telephone wire, or the like, or any combination thereof. The wireless connection may include Bluetooth, Wi-Fi, WiMax, WLAN, ZigBee, mobile network (e.g., 3G, 4G, 5G, etc.), or the like, or a combination thereof. In some embodiments, the communication port 240 may be a standardized communication port, such as RS232, RS485, etc. In some embodiments, the communication port 240 may be a specially designed communication port. For example, the communication port 340 may be designed in accordance with the digital imaging and communications in medicine (DICOM) protocol.

Figure 3:
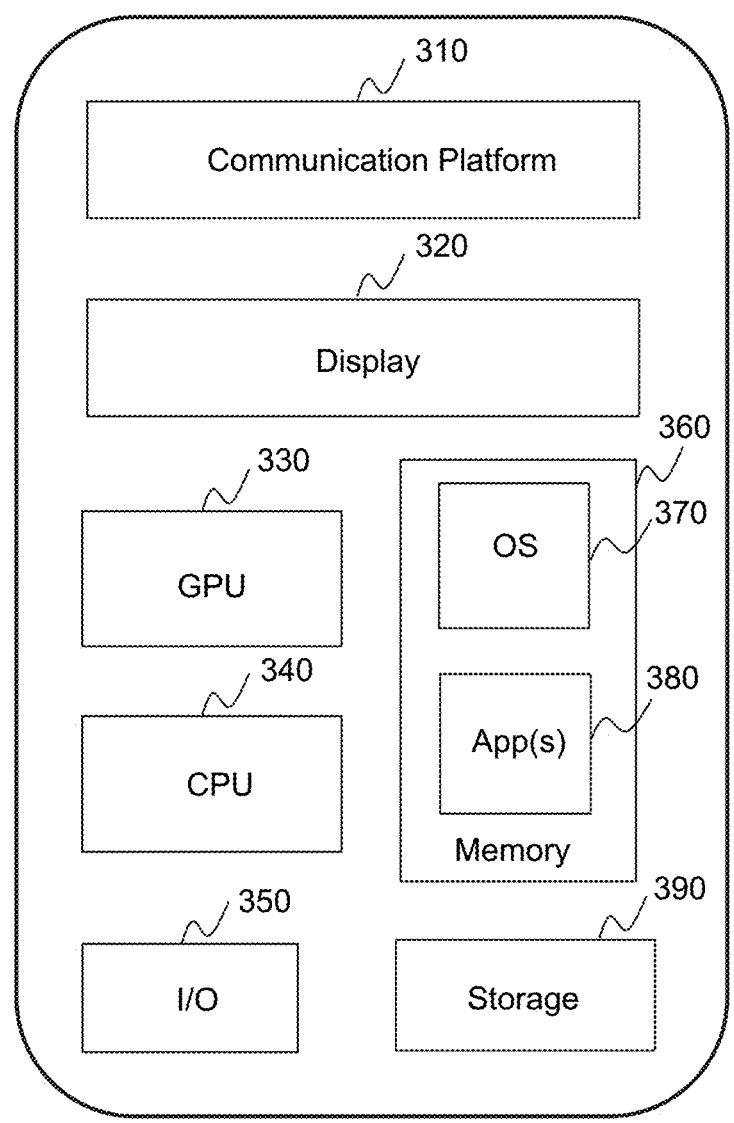
FIG. 3 is a schematic diagram illustrating exemplary hardware and/or software components of an exemplary mobile device according to some embodiments of the present disclosure.

FIG. 3 is a schematic diagram illustrating exemplary hardware and/or software components of an exemplary mobile device according to some embodiments of the present disclosure. In some embodiments, the terminal device 130 may be implemented on the mobile device 300. As illustrated in FIG. 3, the mobile device 300 may include a communication platform 310, a display 320, a graphic processing unit (GPU) 330, a central processing unit (CPU) 340, an I/O 350, a memory 360, and a storage 390. In some embodiments, any other suitable component, including but not limited to a system bus or a controller (not shown), may also be included in the mobile device 300.

In some embodiments, a mobile operating system 370 (e.g., iOS, Android, Windows Phone, etc.) and one or more applications 380 may be loaded into the memory 360 from the storage 390 in order to be executed by the CPU 340. The applications 380 may include a browser or any other suitable mobile apps for receiving and rendering information relating to image processing or other information from the processing device 140. User interactions with the information stream may be achieved via the I/O 350 and provided to the processing device 140 and/or other components of the Imaging system 100 via the network 120.

To implement various modules, units, and their functionalities described in the present disclosure, computer hardware platforms may be used as the hardware platform(s) for one or more of the elements described herein. The hardware elements, operating systems and programming languages of such computers are conventional in nature, and it is presumed that those skilled in the art are adequately familiar therewith to adapt those technologies to the blood pressure monitoring as described herein. A computer with user interface elements may be used to implement a personal computer (PC) or another type of work station or terminal device, although a computer may also act as a server if appropriately programmed. It is believed that those skilled in the art are familiar with the structure, programming and general operation of such computer equipment and as a result the drawings should be self-explanatory.

Figure 4:
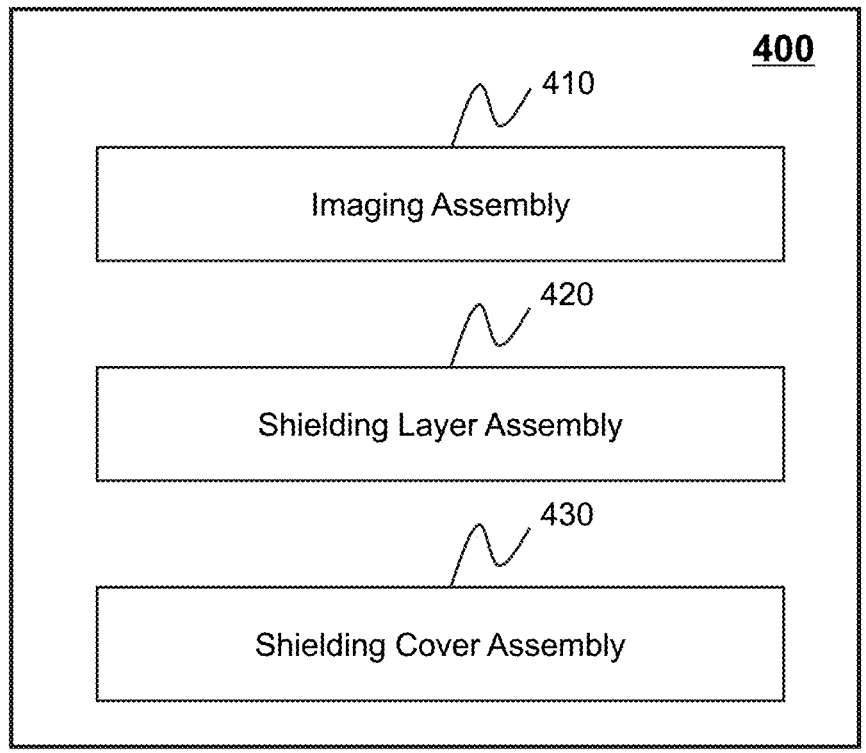
FIG. 4 is a schematic diagram illustrating exemplary components of an imaging system according to some embodiments of the present disclosure.

FIG. 4 is a schematic diagram illustrating exemplary components of an exemplary imaging system 400 according to some embodiments of the present disclosure. In some embodiments, the imaging system 100 described in connection with FIG. 1 may be implemented on the imaging system 400. As illustrated in FIG. 4, the imaging system 400 may include an imaging assembly 410, a shielding layer assembly 420, and a shielding cover assembly 430.

The imaging assembly 410 may be configured to image a subject. In some embodiments, the imaging assembly 410 may be or include an imaging device. The imaging device may scan a subject located within its detection region and generate data relating to the subject. The subject may be biological or non-biological. For example, the subject may include a patient, a man-made object, etc. As another example, the subject may include a specific portion, organ, and/or tissue of the patient. For example, the subject may include the head, a hand, the neck, the thorax, the heart, the stomach, a blood vessel, soft tissue, a tumor, nodules, an arm, a leg, or the like, or any combination thereof.

In some embodiments, the imaging assembly 410 may include a scanner (e.g., the scanner 110 illustrated in FIG. 1). In some embodiments, the scanner may include a radio frequency (RF) coil component, a gradient coil component, and a main magnet component. The main magnet component may generate a main magnetic field that may be applied to a subject exposed inside the field. The main magnet component may include a resistive magnet or a superconductive magnet and may need a power supply for operation. Alternatively, the main magnet component may include a permanent magnet. The main magnet component may include a cavity, and the subject may be placed within the cavity for imaging. The main magnet component may be configured to maintain the homogeneity of the generated main magnetic field. The main magnet component may be equipped with one or more shim coils. The shim coils may be disposed inside the main magnet component (e.g., between the main magnet component and the gradient coil component) and may compensate for the inhomogeneity of the magnetic field generated by the main magnet component. The shim coils may be energized by a shim power supply. The gradient coil component may be located inside the main magnet component. The gradient coil component may generate one or more gradient fields (e.g., gradient fields Gx, Gy, and/or Gz). The gradient field(s) may be superimposed on the main magnetic field generated by the main magnet component and distort the main magnetic field so that the magnetic orientations of the protons of the subject may vary as a function of their positions inside the gradient field, thereby encoding spatial information into MR signals related to the region of the subject being imaged. The gradient coil component may include three sets of coils (e.g., X coils, Y coils, and Z coils) configured to generate three different magnetic fields that are used for position encoding. The gradient coil component may allow spatial encoding of MR signals for image construction. The RF coil component may be located inside the main magnet component and serve as transmitters, receivers, or both. When used as transmitters, the RF coil component may generate an RF field that is utilized to generate MR signals related to the region of the subject being imaged. A direction of the RF field may be perpendicular to a direction of the main magnetic field. When used as receivers, the RF coil component may be configured to detect MR signals (e.g., echoes). After excitation, the MR signals generated by the subject may be sensed by the RF coil component. In some embodiments, the sensed MR signals may be amplified and/or transformed into digital signals. The digital MR signals then may be sent to the processing device 140 for sampling. In some embodiments, the gradient coil component and the RF coil component may be circumferentially positioned with respect to the subject. It is understood by those skilled in the art that the main magnet component, the gradient coil component, and the RF coil component may be situated in a variety of configurations around the subject.

In some embodiments, the imaging assembly 410 may include a supporting component configured to support a table. The table may be configured to support the subject and/or carry the subject in or out of a cavity of the scanner (i.e., the cavity of the main magnet component). The supporting component may be fixed or mobile. In some embodiments, the supporting component may be fixedly connected to the scanner (e.g., the main magnet component) or the ground. For instance, the scanner may include a first surface and a second surface disposed opposite to each other in an axial direction of the scanner. The supporting component may include a first supporting unit disposed on a side of the first surface and/or a second supporting unit disposed on a side of the second surface of the scanner. Merely by way of example, the first supporting unit may be fixedly connected to the main magnet component. The first supporting unit may face to the first surface of the scanner, and thus, a contact surface of the first supporting unit and the main magnet component may be substantially within or close to the first surface. The second supporting unit may be fixedly connected to the main magnet component. The second supporting unit may face to the second surface of the scanner, and thus, a contact surface of the second supporting unit and the main magnet component may be substantially within or close to the second surface. The table may be moveable relative to the supporting component, for example, via a table rail disposed on the supporting component. Merely by way of example, the table rail may include one or more table rails disposed on the supporting component (e.g., an upper surface of the second supporting unit) and pass through the cavity (e.g., extending into the cavity). In some embodiments, the main magnet component may be relatively heavy, and thus, the first supporting unit and/or the second supporting unit fixedly connected to the main magnet component may have relatively high stability. In such cases, the table may move on the supporting component stably. In some embodiments, the supporting component may include one or more slidable wheels at a lower end (e.g., a bottom) of the supporting component. The supporting component may move relative to the scanner via the one or more slidable wheels. In such cases, the supporting component may be used as a vehicle for carrying a patient. For example, before an imaging process of the imaging assembly 410, the patient may lie on the table of the supporting component and be carried to the scanner. Then the table may be caused to move into the cavity of the scanner for imaging.

In some embodiments, electromagnetic waves generated by an external device (e.g., a telephone, a transformer, etc.) may interfere with waveforms/signals generated inside the scanner, and may further affect the stability and/or homogeneity of the magnetic fields (e.g., the main magnetic field generated, the one or more gradient fields, the RF field). In such occasion, the operation of the imaging assembly 410 may be affected by an EMI caused by the external device, and the imaging quality of the imaging assembly 410 may be affected. In some embodiments, a shielding system (e.g., a shielding system including the shielding layer assembly 420 and/or the shielding cover assembly 430) may be used to reduce or shield the EMI.

The shielding layer assembly 420 may be disposed on at least a first portion of the imaging assembly 410. In some embodiments, the first portion of the imaging assembly 410 may include the scanner and/or the supporting component. In some embodiments, the shielding layer assembly 420 may include a first shielding layer (e.g., the first shielding layer 522 in FIG. 5B) disposed on the scanner. For example, as shown in FIG. 5B, the first shielding layer 522 may be disposed on a shell of the scanner. As another example, the first shielding layer 522 may be disposed on at least a portion of a peripheral surface of the cavity of the scanner 512. As still another example, the first shielding layer may be disposed on at least a portion of the main magnet component. In some embodiments, the shielding layer assembly 420 may include a second shielding layer (e.g., the second shielding layer 524 in FIG. 5B) disposed on at least a portion of the supporting component. For example, the second shielding layer may include a first portion of the second shielding layer including a first shielding layer unit (e.g., the first shielding layer unit 524-2 in FIG. 5B) disposed on at least a portion (e.g., a bottom surface) of the first supporting unit, and/or a second portion of the second shielding layer including a second shielding layer unit (e.g., the second shielding layer unit 524-4 in FIG. 5B) disposed on at least a portion (e.g., a bottom surface) of the second supporting unit. In some embodiments, the first shielding layer unit and/or the second shielding layer unit may be coupled to the first shielding layer.

The shielding cover assembly 430 may be disposed on at least a second portion of the imaging assembly 410. In some embodiments, the second portion of the imaging assembly 410 may include the supporting component. In some embodiments, the shielding cover assembly 430 may include a first shielding cover (e.g., the first shielding cover 532 in FIG. 5B) coupled to the first shielding layer and at least a first portion of the second shielding layer (e.g., the first shielding layer unit). In some embodiments, the shielding cover assembly may further include a second shielding cover (e.g., the second shielding cover 534 in FIG. 5B) coupled to the first shielding layer and at least a second portion of the second shielding layer (e.g., the second shielding layer unit).

In some embodiments, the first shielding cover and/or the second shielding cover may be moveable or detachable. Taking the second shielding cover as an example, the supporting component may include a guide unit configured to guide a movement of the second shielding cover. The second shielding cover may be slidable along the guide unit in the axial direction of the scanner. For example, the guide unit may include two rails disposed on the upper surface of the supporting component (e.g., near two axial edges of the upper surface) and along the axial direction of the scanner. The two rails may be parallel to each other and a distance between the two rails may be consistent with a width of the second shielding cover in a direction perpendicular to the axial direction of the scanner. Optionally or additionally, the table rail configured to guide the table may also include two table rails disposed on the upper surface of the supporting component and along the axial direction of the scanner. For example, the two table rails may be disposed between the two rails of the guide unit. A distance between the two table rails may be less than the distance between the two rails of the guide unit. In such cases, the movements of the table and the second shielding cover may not affect each other. In some embodiments, the imaging system 400 may further include a driving component configured to drive the second shielding cover to slide along the guide unit in the axial direction of the scanner. In some embodiments, the imaging system 400 may further include a rocker assembly. The rocker assembly may be operable to control a movement of the second shielding cover. In some embodiments, one end of the rocker assembly may be coupled to the second shielding cover and another end of the rocker assembly may be coupled to the supporting component. When the rocker assembly is operated by a user (or the driving component), the second shielding cover may move relative to the scanner. In some embodiments, the second shielding cover may be slidable along a direction perpendicular to the axial direction of the scanner. For example, another guide unit may be disposed on the second surface of the scanner, and the second shielding cover may be slidable along the guide unit in the direction perpendicular to the axial direction of the scanner.

In some embodiments, the first shielding cover and/or the second shielding cover may include a rotatable structure. For example, at least a portion of the second shielding cover may be coupled to the supporting component via a hinged connection. In such cases, the second shielding cover may rotate around the hinged connection to achieve an open state or a closed state. Taking the second shielding cover 534 in FIG. 5B as an example, in the closed state, the second shielding cover 534 may be coupled to the second supporting unit 514-4 and the second surface 512-6 of the scanner 512. The inner space of the second shielding cover 534 may be connected to the cavity 512-2 of the scanner 512. The inner space of the second shielding cover 534 may be electromagnetically closed with respect to the outside space of the second shielding cover 534. Correspondingly, in the open state, the second shielding cover 534 may not be coupled to the second supporting unit 514-4 and/or the second surface 512-6 of the scanner 512. The inner space of the second shielding cover 534 may not be electromagnetically closed with respect to the outside space of the second shielding cover 534.

In some embodiments, the shielding cover assembly 430 may be coupled to the shielding layer assembly 420. For example, the first shielding layer unit and/or the second shielding layer unit may be coupled to the first shielding layer, the first shielding cover may be coupled to the first shielding layer and the first portion of the second shielding layer, and the second shielding cover may be coupled to the first shielding layer and the second portion of the second shielding layer. As used herein, the term "coupled to" refers to a connection manner between the shielding cover assembly 430 and the shielding layer assembly 420. In some embodiments, the connection between the shielding cover assembly 430 and the shielding layer assembly 420 may include a contact connection. For example, at least a portion of the shielding cover assembly 430 may abut against the shielding layer assembly 420 directly. As another example, at least a portion of the shielding cover assembly 430 may be connected to the shielding layer assembly 420 via a connecting component. For instance, a contact surface on the shielding layer assembly 420 (e.g., the second surface of the scanner) may include a set of leaf springs. The second shielding cover of the shielding cover assembly 430 may abut against the set of leaf springs and thus connect to the shielding layer assembly 420 indirectly. In some embodiments, the connection between the shielding cover assembly 430 and the shielding layer assembly 420 may include a non-contact connection. For example, when the shielding cover assembly 430 is coupled to the shielding layer assembly 420, there may be one or more gaps and/or holes between the shielding cover assembly 430 and the shielding layer assembly 420. More description of the gaps and/or holes between the shielding cover assembly 430 and the shielding layer assembly 420 may be found elsewhere in the present disclosure (e.g., Equation (3) and descriptions thereof).

In some embodiments, when the shielding cover assembly 430 is coupled to the shielding layer assembly 420, the shielding cover assembly 430 and the shielding layer assembly 420 may shield the imaging device from the EMI. For example, when the shielding cover assembly 430 is coupled to the shielding layer assembly 420, the shielding cover assembly 430 and the shielding layer assembly 420 may be combined to form a shielding space. The shielding cover assembly 430 and the shielding layer assembly 420 may be configured to shield the shielding space against electromagnetic waves from an outside of the shielding space. In such cases, the electromagnetic waves may be prevented from entering the inside of the shielding space, and thus, the imaging device may be shielded from the EMI. In some embodiments, the shielding cover assembly 430 and the shielding layer assembly 420 coupled to each other may be used as a shielding enclosure surrounding the imaging assembly 410. The shielding enclosure may be referred to as a Faraday cage or a Faraday shield. According to the principle of electromagnetic shielding, an electrostatic repulsion of charges in the Faraday cage may cause a redistribution of charge to an outside of the Faraday cage, which may result in that a net electrostatic field within the Faraday cage is zero. In such cases, electromagnetic waves generated by external or internal electromagnetic fields may be dissipated, thereby blocking a large amount of EMI. In some embodiments, the Faraday cage may be made of an electromagnetic shielding material. Exemplary electromagnetic shielding materials may include a conductive material, a magnetic material, or the like, or any combination thereof. Merely by way of example, the shielding cover assembly 430 and the shielding layer assembly 420 may be made of a metallic material with a conductive property. In some embodiments, the Faraday cage may be formed by a continuous covering of the electromagnetic shielding material. For example, both the shielding cover assembly 430 and the shielding layer assembly 420 may include a flake structure. When the shielding cover assembly 430 is coupled to the shielding layer assembly 420, a Faraday cage without gaps may be formed. In some embodiments, the Faraday cage may include a mesh structure. For example, both the shielding cover assembly 430 and the shielding layer assembly 420 may include a mesh structure. When the shielding cover assembly 430 is coupled to the shielding layer assembly 420, a Faraday cage with a mesh structure may be formed. As another example, at least a portion (e.g., the first shielding cover and/or the second shielding cover) of the shielding cover assembly 430 may include a mesh structure, and the shielding layer assembly 420 may include a flake structure. In some embodiments, when the shielding cover assembly 430 is coupled to the shielding layer assembly 420, a Faraday cage with both the flake structure and the mesh structure may be formed.

In some embodiments, external electromagnetic waves may pass through the Faraday cage with an attenuation. The attenuation may include a reflection loss on a surface of the Faraday cage, and an attenuation loss in the shielding assembly (e.g., the shielding cover assembly 430, and/or the shielding layer assembly 420) of the Faraday cage. The reflection loss may be positively correlated with a difference between a characteristic impedance of the space outside the shielding assembly and a characteristic impedance of the shielding assembly. In some embodiments, a difference between a characteristic impedance of the air and a characteristic impedance of the metal may be relatively large. Taking a shielding layer made of copper as an example, when an electromagnetic wave with a frequency greater than a working frequency of the MRI scanner passes through the shielding layer, a reflection loss of the electromagnetic wave may be 100 decibel (dB). In some embodiments, when the electromagnetic wave passes through the shielding assembly, the current density may be largest near the outer surface of the shielding assembly and may decrease exponentially from the outer surface to the inside of the shielding assembly. Correspondingly, the attenuation loss of the electromagnetic wave may increase exponentially from the outer surface to the inside of the shielding assembly, which may be referred to as a skin effect. Merely by way of example, the attenuation loss of the electromagnetic wave passing through the shielding assembly may be expressed by Equation (1) as below:

$$J(x) = J(0)e^{-x\sqrt{\pi\mu\sigma f}}, \tag{1}$$

where $J(x)$ denotes a current density at a depth x of the shielding assembly, $J(0)$ denotes a current density on the outer surface of the shielding assembly, $\mu$ denotes a magnetic permeability of the shielding assembly, $\sigma$ denotes an electrical conductivity of the shielding assembly, and $f$ denotes a frequency of the electromagnetic wave.

In some embodiments, when the current density decreases to $e^{-1}$ of the current density $J(0)$ on the outer surface of the shielding assembly, the depth x may be defined as a skin depth $\delta$. According to Equation (1), the skin depth $\delta$ may be expressed by Equation (2) as below:

$$\delta = 1/\sqrt{\pi\mu\sigma f}. \tag{2}$$

In some embodiments, a thickness of the shielding assembly may be larger than the skin depth δ such that a large portion of the electromagnetic waves may be shielded. According to Equation (1), the skin depth δ may have a relatively small value. Correspondingly, the shielding assembly may have a relatively small thickness, and may be used to shield the EMI effectively.

In some embodiments, at least a portion (e.g., the second shielding cover) of the Faraday cage may include a mesh structure. The mesh structure may include a plurality of gaps and/or holes through which light and/or air may enter the Faraday cage. Additionally, heat generated by the scanner during its operation may also be dissipated through the plurality of gaps and/or holes. In some embodiments, the electromagnetic wave may leak through the gaps and/or holes, which may lead to a decrease in a shielding effectiveness (SE) of the Faraday cage. In some embodiments, the SE of the Faraday cage may be negatively correlated to sizes of the gaps and/or the holes. Taking a Faraday cage with a plurality of holes as an example, the SE of the Faraday cage to the electromagnetic wave may be expressed by Equation (3) as below:

$$SE = 20 \log_{10} \lambda/2d, \quad (3)$$

where λ denotes a wavelength of the electromagnetic wave to be shielded, and d denotes a diameter of a hole on the Faraday cage. In some embodiments, the wavelength λ of the electromagnetic wave to be shielded may be determined according to an operating frequency of the scanner of the imaging assembly 410. For example, the wavelength λ of the electromagnetic wave to be shielded may be less than a wavelength corresponding to the operating frequency of the scanner. In some embodiments, according to Equation (3), the diameter d of the hole may be determined according to the wavelength λ and/or a desired SE. Optionally or additionally, the SE and the sizes of the gaps and/or the holes may also be determined according to a simulation design and/or an experimental testing.

It should be noted that the above description of the imaging system 400 is merely provided for the purposes of illustration and not intended to limit the scope of the present disclosure. For persons having ordinary skill in the art, multiple variations and modifications may be made under the teachings of the present disclosure. However, those variations and modifications do not depart from the scope of the present disclosure. In some embodiments, one or more other components may be included in the imaging system 400. For example, the imaging system 400 may include a control assembly configured to control a movement of at least one portion of the shielding cover assembly 430 and/or control an operation of the imaging assembly 410. As another example, the imaging system 400 may include a storage assembly configured to store data and/or instructions that the control assembly may execute or use to perform exemplary methods described in the present disclosure. In some embodiments, one or more components of the imaging system 400 may be omitted. For example, the shielding layer assembly 420 and/or the shielding cover assembly 430 may be integrated into the imaging assembly 410 as components of the imaging assembly 410.

Figure 5A:
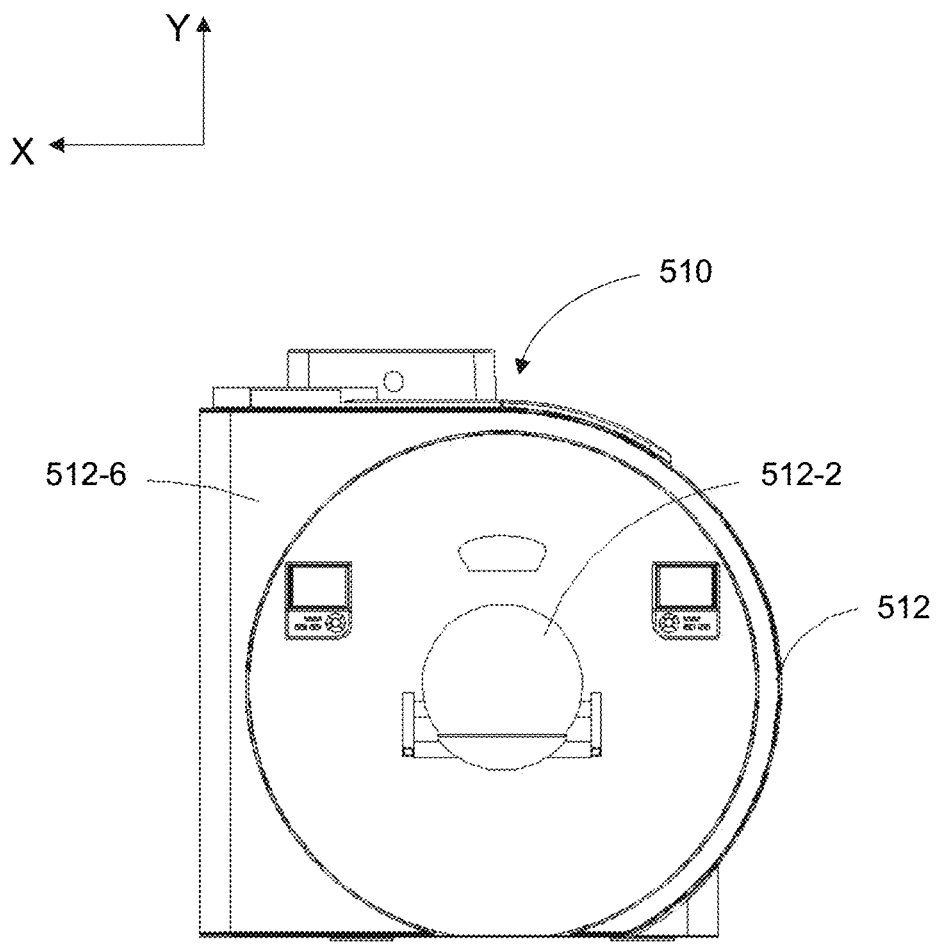
FIGS. 5A and 5B are schematic diagrams illustrating an exemplary imaging system from different perspectives according to some embodiments of the present disclosure.
Figure 5B:
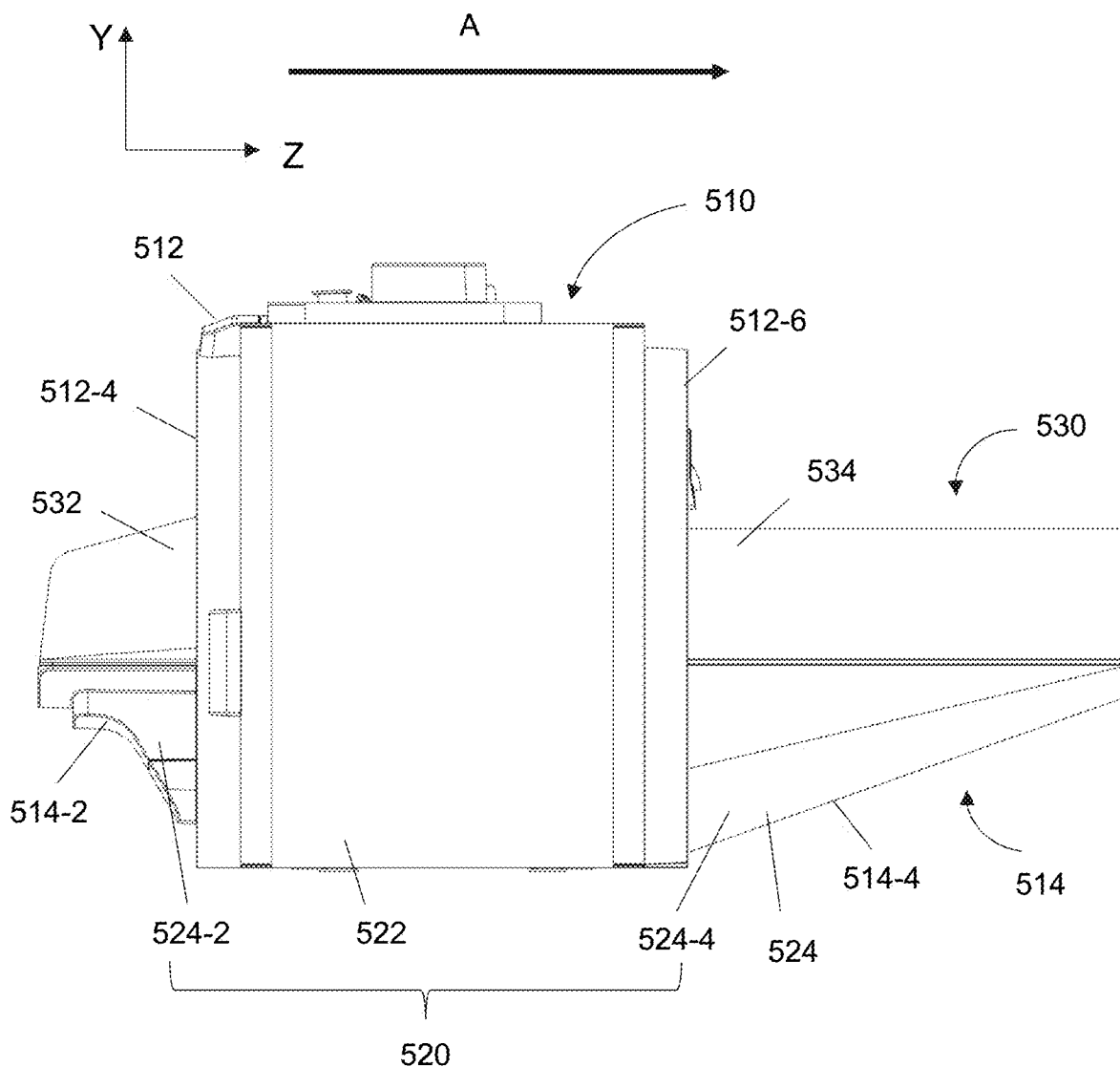

FIGS. 5A and 5B are schematic diagrams illustrating an exemplary imaging system 500 from different perspectives according to some embodiments of the present disclosure. In some embodiments, the imaging system 100 illustrated in FIG. 1 and/or the imaging system 400 illustrated in FIG. 4 may be implemented as the imaging system 500. In some embodiments, the imaging system 500 may include an MRI system. For example, the MRI system may include a closed MRI system (i.e., an MRI system with an imaging region enclosed in a main magnet component). The MRI system may be configured to image a human or an animal. As shown in FIGS. 5A and 5B, the imaging system 500 may include an imaging device 510, a shielding layer assembly 520, and a shielding cover assembly 530.

The imaging device 510 may include a scanner 512 and a supporting component 514. In some embodiments, the scanner 512 may be configured as a main body of the imaging system 500, and can support (or assist to support) one or more other components (e.g., the supporting component 514) of the imaging system 500. The scanner 512 may include one or more components such as a main magnet component, a gradient coil component, and a radio frequency (RF) coil component. The main magnet component, the gradient coil component, and the radio frequency coil component may be sequentially distributed from an inside to an outside of the scanner 512, thereby forming the scanner 512 with a closed shape (i.e., an enclosed shape whose line segments and/or curves on the surface are connected or meet). Exemplary closed shapes may include a circular closed shape, a square closed shape, or the like, or any combination thereof. The scanner 512 may further include a cavity 512-2. The cavity 512-2 may be disposed in the main magnet component. A subject to be imaged by the imaging device 510 may be placed within the cavity 512-2. In some embodiments, the cavity 512-2 may be a cylindrical through hole. A size (e.g., a diameter) of the cavity 512-2 may vary according to a size of the subject to be imaged. For example, the diameter of the cavity 512-2 may be in a range from 45 to 85 centimeters. As another example, the diameter of the cavity 512-2 may be in a range from 16 to 40 centimeters, which may be suitable for accommodating a human body or an animal.

The supporting component 514 may be configured to support a table (not shown). The table may be configured to support the subject and/or carry the subject in or out of the cavity 512-2. In some embodiments, the supporting component 514 may be connected to the scanner 512. For example, the scanner 512 may include a first surface 512-4 and a second surface 512-6 disposed opposite to each other in an axial direction (e.g., the direction indicated by the arrow A) of the scanner 512. The supporting component 514 may include a first supporting unit 514-2 disposed on a side of the first surface 512-4, and/or a second supporting unit 514-4 disposed on a side of the second surface 512-6 of the scanner 512. Optionally or additionally, the supporting component 514 may be fixed on the scanner 512 via a mechanical connection (e.g., a welded connection, a bolted connection, a snap connection, an integrated molding, etc.) or a non-mechanical connection (e.g., an adhesive connection, a contact connection). For example, the first supporting unit 514-2 may be fixed to the main magnet component from the side of the first surface 512-4 via a bolted connection. The second supporting unit 514-4 may be fixed to the main magnet component from the side of the second surface 512-6 via a bolted connection.

The shielding layer assembly 520 may be disposed on a first portion of the imaging device 510. In some embodiments, the first portion of the imaging assembly 410 may include the scanner 512 and/or the supporting component 514. As illustrated in FIG. 5B, the shielding layer assembly 520 may include a first shielding layer 522 and a second shielding layer 524. The first shielding layer 522 may be disposed on the scanner 512. In some embodiments, the first shielding layer 522 may be disposed on a shell of the scanner 512. For example, the scanner 512 may include a shell disposed between the first surface 512-4 and the second surface 512-6. The first shielding layer 522 may be disposed on an outer surface of the shell. Optionally or additionally, the first shielding layer 522 may be disposed on an inner surface of the shell. In such cases, the first shielding layer 522 may be disposed on at least a portion of a peripheral surface of the cavity 512-2. The least a portion of the peripheral surface of the cavity 512-2 may include a portion of the first surface 512-4 (e.g., a portion of the first surface 512-4 excluding a first opening of the cavity 512-2), a portion of the second surface 512-6 (e.g., a portion of the second surface 512-6 excluding a second opening of the cavity 512-2), and the portion between the first surface 512-4 and the second surface 512-6. In some embodiments, the first shielding layer 522 may be configured as a coating on an outer surface and/or an inner surface of the shell. In some embodiments, the first shielding layer 522 may be embedded in the shell (e.g., as a sandwich). In some embodiments, the shell itself may be used as first shielding layer 522. In some embodiments, the first shielding layer 522 may be disposed on at least a portion of the main magnet component of the scanner 512. For example, the main magnet component may include a cryostat, and superconducting coils disposed inside the cryostat. The first shielding layer 522 may be disposed outside the cryostat. In some embodiments, the first shielding layer 522 may include a one-piece structure or a split structure (e.g., a multi-piece structure), which may be disposed on one-quarter, one-third, or one-half of an outer surface of the scanner 512.

The second shielding layer 524 may be disposed on at least a portion (e.g., a bottom surface) of the supporting component 514. For example, the second shielding layer 524 may include a first shielding layer unit 524-2 and a second shielding layer unit 524-4. The first shielding layer unit 524-2 may be disposed on at least a portion (e.g., a bottom surface) of the first supporting unit 514-2. The second shielding layer unit 524-4 may be disposed on at least a portion (e.g., a bottom surface) of the second supporting unit 514-4. In some embodiments, the second shielding layer 524 may be disposed on the supporting component 514 directly (i.e., as a shell of the supporting component 514). In some embodiments, the second shielding layer 524 may be configured as a coating on an outer surface of the supporting component 514. In some embodiments, the second shielding layer 524 may be embedded in the supporting component 514. In some embodiments, the first shielding layer unit 524-2 and/or the second shielding layer unit 524-4 may be coupled to the first shielding layer 522. As described in connection with FIG. 4, the term "coupled to" refers to a connection manner between the shielding layer unit 524-2 (and/or the second shielding layer unit 524-4) and the first shielding layer 522. In some embodiments, the connection manner between the shielding layer unit 524-2 (and/or the second shielding layer unit 524-4) and the first shielding layer 522 may achieve an electromagnetic shielding effect. The connection manner may include a contact connection or a non-contact connection. For example, the first shielding layer unit 524-2 (and/or the second shielding layer unit 524-4) may abut against the first shielding layer 522 directly. As another example, the first shielding layer unit 524-2 (and/or the second shielding layer unit 524-4) may be connected to the first shielding layer 522 via a connecting component. More description of the connecting component may be found elsewhere in the present disclosure (e.g., FIGS. 6A and 6B, and the descriptions thereof). As a further example, there may be one or more gaps and/or holes in a connection portion between the first shielding layer unit 524-2 (and/or the second shielding layer unit 524-4) and the first shielding layer 522.

In some embodiments, the shielding layer assembly 520 may be disposed on the imaging device 510 in any suitable manner. For example, the shielding layer assembly 520 may be plated on corresponding portions of the surface of the imaging device 510. As another example, the shielding layer assembly 520 may be disposed on corresponding portions of the surface of the imaging device 510 by pasting.

The shielding cover assembly 530 may be disposed on a second portion of the imaging device 510. In some embodiments, the second portion of the imaging device 510 may include the supporting component 514. In some embodiments, the shielding cover assembly 530 may be disposed at one or more openings of the cavity 512-2. A count of shielding covers of the shielding cover assembly 530 may correspond to a count of the openings of the cavity 512-2. As illustrated in FIG. 5B, the shielding cover assembly 530 may include a first shielding cover 532 and a second shielding cover 534. In some embodiments, the cavity 512-2 may include a first opening on the first surface 512-4, and/or a second opening on the second surface 512-6. The first shielding cover 532 may be configured to cover the first opening, and the first supporting unit 514-2 may support the first shielding cover 532. The second shielding cover 534 may be configured to cover the second opening, and the second supporting unit 514-4 may support the second shielding cover 534. The first shielding cover 532 may be disposed above the first supporting unit 514-2. The second shielding cover 534 may be disposed above the second supporting unit 514-4. In some embodiments, the first shielding cover 532 and/or second shielding cover 534 may have any shape (e.g., a half cylinder) suitable for accommodating a subject (e.g., a human body). In some embodiments, the first shielding cover 532 may be coupled to the first shielding layer 522 and/or the first shielding layer unit 524-2. For example, the first shielding cover 532 may include a first edge (on the side of the first surface 512-4) corresponding to the first shielding layer 522 and a second edge (at the bottom of the first shielding cover 532) corresponding to the first shielding layer unit 524-2. The first edge of the first shielding cover 532 may abut against (e.g., contact, or fixed on) the first shielding layer 522 on the side of the first surface 512-4. The second edge of the first shielding cover 532 may abut against (e.g., contact, or fixed on) the first shielding layer unit 524-2. In some embodiments, the second shielding cover 534 may be coupled to the first shielding layer 522 and/or the second shielding layer unit 524-4. For example, the second shielding cover 534 may include a first edge (on the side of the second surface 512-6) corresponding to the first shielding layer 522 and a second edge (at the bottom of the second shielding cover 534) corresponding to the second shielding layer unit 524-4. The first edge of the second shielding cover 534 may abut against (e.g., contact, or fixed on) the first shielding layer 522 on the side of the second surface 512-6. The second edge of the second shielding cover 534 may abut against (e.g., contact, or fixed on) the second shielding layer unit 524-4. In such cases, the first opening of the cavity 512-2 on the first surface 512-4 may be covered by the first shielding cover 532, and the second opening of the cavity 512-2 on the second surface 512-6 may be covered by the second shielding cover 534. Accordingly, a shielding enclosure (including the first shielding layer 522, the first shielding layer unit 524-2, the second shielding layer unit 524-4, the first shielding cover 532, and the second shielding cover 534) may be formed and may block electromagnetic waves generated by an external device from entering the cavity 512-2 via the openings. In some embodiments, when the first shielding cover 532 (or the second shielding cover 534) is coupled to the first shielding layer 522 and the first shielding layer unit 524-2 (or the second shielding layer unit 524-4), the first shielding cover 532 (or the second shielding cover 534) may be considered to be in a closed state. Correspondingly, when the first shielding cover 532 (or the second shielding cover 534) is not coupled to the first shielding layer 522 and the first shielding layer unit 524-2 (or the second shielding layer unit 524-4), the first shielding cover 532 (or the second shielding cover 534) may be considered to be in an open state.

Additionally, the cavity 512-2, the first shielding layer unit 524-2, the second shielding layer unit 524-4, the first shielding cover 532, and/or the second shielding cover 534 may form a closed cavity. The table may be supported by the first supporting unit 514-2 and/or the second supporting unit 514-4, and may be covered by the first shielding cover 532 and/or the second shielding cover 534. In some embodiments, the table may move in the axial direction of the scanner 512 in the closed cavity so as to move in or out of the cavity 512-2. Merely by way of example, before or during an imaging process, the table may move in the cavity 512-2 (e.g., via a table rail disposed on the supporting component 514). The first shielding cover 532 or the second shielding cover 534 may be in the closed state so as to be coupled to the shielding layer assembly 520. After the imaging process is finished or terminated, the table may be moved out of the cavity 512-2. The first shielding cover 532 or the second shielding cover 534 may be switched to the open state to facilitate the subject to leave the table.

In some embodiments, when the first shielding cover 532 is coupled to the first shielding layer 522 and the first shielding layer unit 524-2, and the second shielding cover 534 is coupled to the first shielding layer 522 and the second shielding layer unit 524-4, the shielding enclosure (i.e., a Faraday cage) may be formed. The shielding enclosure may be configured to shield the imaging device 510 from an EMI. In such cases, MR signals in the scanner 512 may not be interfered by the electromagnetic waves generated by external device(s), thereby improving an imaging quality of the imaging device 510.

In some embodiments, the shielding layer assembly 520 and/or the shielding cover assembly 530 may be made of an electromagnetic shielding material. Exemplary electromagnetic shielding materials may include a conductive material, a magnetic material, or the like, or any combination thereof. In some embodiments, the shielding layer assembly 520 and/or the shielding cover assembly 530 may include a mesh structure. In some embodiments, the mesh structure may be light-permeable and/or air-permeable. For example, the first shielding cover 532 and/or the second shielding cover 534 may include an air-permeable mesh structure such that the subject in the cavity 512-2 may breathe freely during an imaging process of the imaging system 500, thereby improving the safety of the imaging system 500. In some embodiments, the mesh structure may include a plurality of gaps and/or holes. Sizes of the gaps and/or holes may be within a certain range so as to prevent electromagnetic waves from entering the scanner 512 from the gaps and/or holes. More description of the sizes of the gaps and/or holes may be found elsewhere in the present disclosure (e.g., FIG. 4 and the descriptions thereof).

In some embodiments, the first shielding cover 532 and/or the second shielding cover 534 may be moveable or detachable. Merely by way of example, the second shielding cover 534 may move in the axial direction of the scanner 512. As another example, the second shielding cover 534 may move in a direction perpendicular to the axial direction of the scanner 512. In some embodiments, the first shielding cover 532 or the second shielding cover 534 may include a rotatable structure. For example, at least a portion of the second shielding cover 534 may be coupled to the supporting component 514 via a hinged connection. The second shielding cover 534 may be opened or closed via the hinged connection. More description of the movement and the rotatable structure of the second shielding cover 534 (or the first shielding cover 532) may be found elsewhere in the present disclosure (e.g., FIGS. 6A-9B and the descriptions thereof).

It should be noted that the examples illustrated in FIGS. 5A and 5B and the above description thereof are merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, the imaging system 500 may include one or more additional components and/or one or more components of the imaging system 500 described above may be omitted. For example, the imaging system 500 may include a control assembly configured to control a movement of the first shielding cover 532 and/or the second shielding cover 534. As another example, the first surface 512-4 of the scanner 512 may be an intact surface without an opening, and the first supporting unit 514-2 may be omitted. Correspondingly, the first supporting unit 514-2, the first shielding layer unit 524-2, and the first shielding cover 532 may be omitted. In some embodiments, the supporting component 514 may be made of an electromagnetic shielding material (e.g., a metallic material) such that the supporting component 514 itself may be used as a shielding layer.

In addition, the positions, the shapes, and/or the sizes of components of the imaging system 500 as shown in FIGS. 5A and 5B are illustrative, and the components may be mounted at any suitable position and have any suitable size and/or shape. Moreover, a connection between two components as illustrated in figures and described above may be variable. For example, the connection between the supporting component 514 and the scanner 512 may be a mechanical connection or a non-mechanical connection.

Figure 6A:
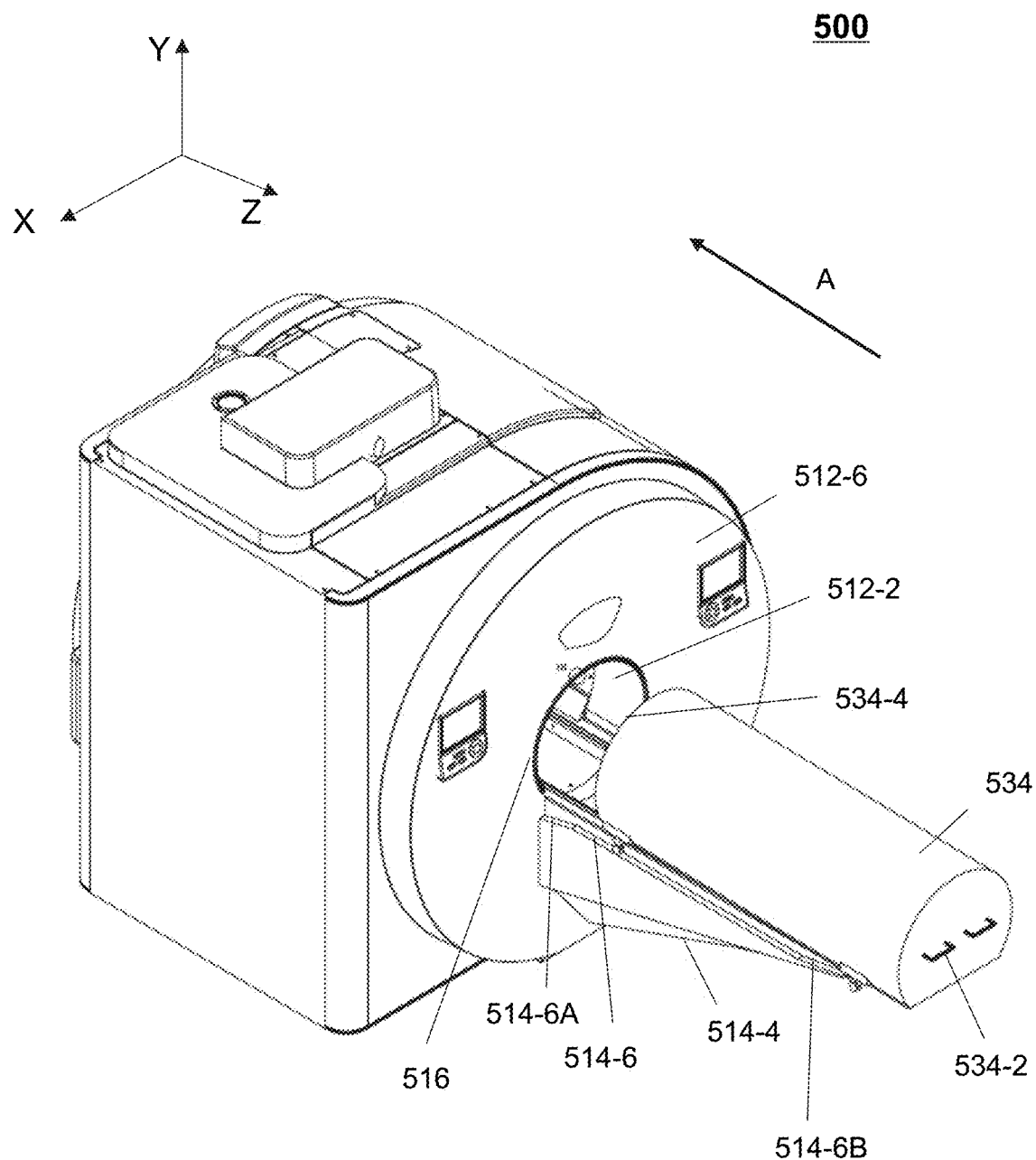
FIG. 6A is a schematic diagram illustrating an exemplary imaging system with a slidable shielding cover according to some embodiments of the present disclosure.
Figure 6B:
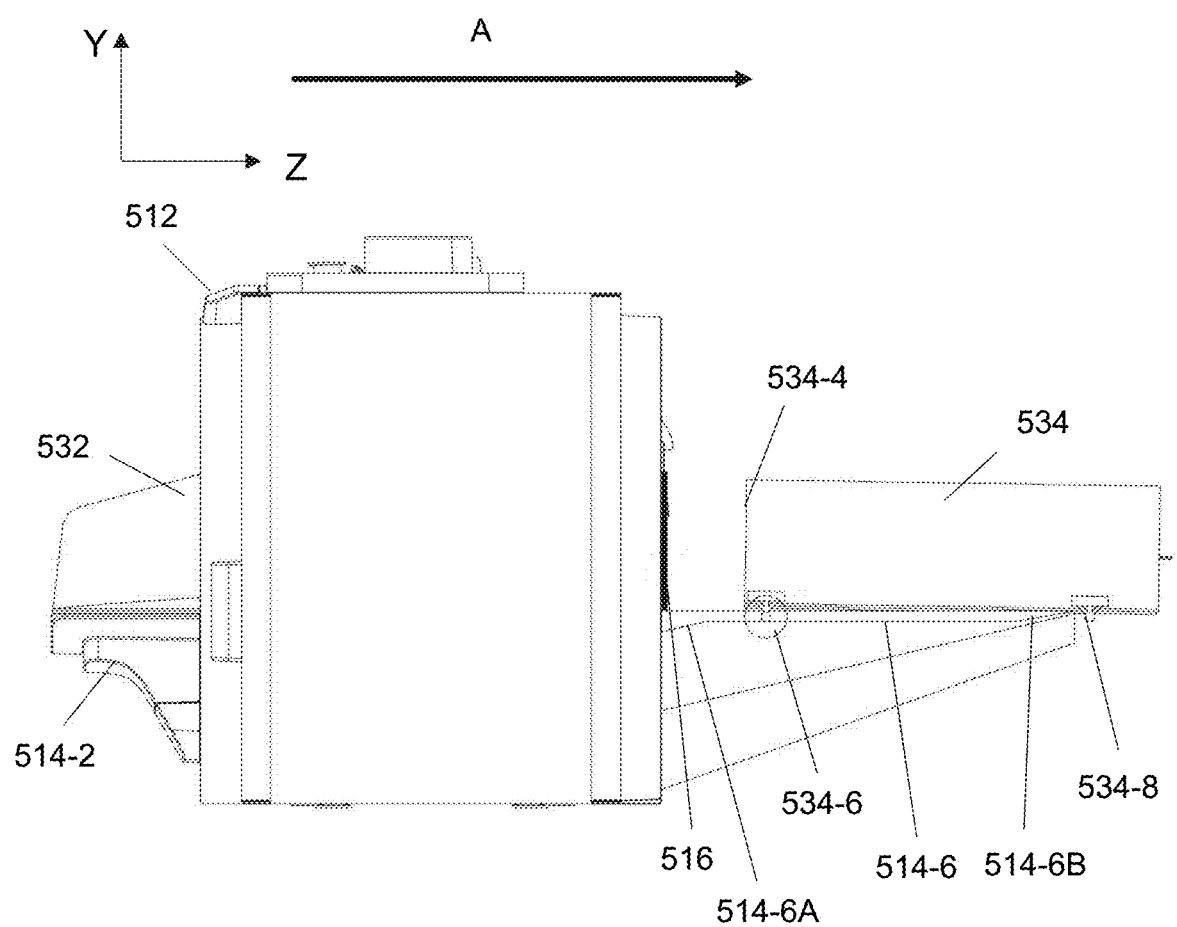
FIG. 6B is a schematic diagram illustrating an exemplary imaging system with limit units according to some embodiments of the present disclosure.

FIG. 6A is a schematic diagram illustrating an exemplary imaging system 500 with a slidable shielding cover according to some embodiments of the present disclosure. As illustrated in FIG. 6A, the supporting component 514 may include a guide unit 514-6. Merely by way of example, the guide unit 514-6 may include one or more rails disposed on the supporting component 514. In some embodiments, the two rails may be symmetrically disposed (e.g., on two sides of the supporting component 514) along a central axis of the supporting component 514. Each rail may correspond to a bottom edge of the second shielding cover 534. The second shielding cover 534 may be slidable along the guide unit 514-6 in the axial direction (e.g., the direction indicated by the arrow A) of the scanner 512. In some embodiments, the second shielding cover 534 may include one or more limit units. In some embodiments, the one or more limit units may be fixed on a bottom edge of the second shielding cover 534. FIG. 6B is a schematic diagram illustrating an exemplary imaging system 500 with limit units according to some embodiments of the present disclosure. As illustrated in FIG. 6B, the second shielding cover 534 may include a limit unit 534-6 disposed on the bottom edge of the second shielding cover 534 close to the scanner 512 and a limit unit 534-8 disposed on the bottom edge of the second shielding cover 534 away from the scanner 512. In some embodiments, the one or more limit units may be matched with the guide unit 514-6. In such cases, the second shielding cover 534 may be slidable along the guide unit 514-6 in the axial direction of the scanner 512 via the one or more limit units. In some embodiments, for each rail of the guide unit 514-6, an upper surface of the rail may be relatively lower than an upper surface of the second supporting unit 514-4. The limit units fixed on the bottom edge of the second shielding cover 534 may be designed such that when the second shielding cover 534 slides along the guide unit 514-6, the bottom edge of the second shielding cover 534 may be coupled to the upper surface of the second supporting unit 514-4, thereby forming an effective electromagnetic connection.

Figure 6C:
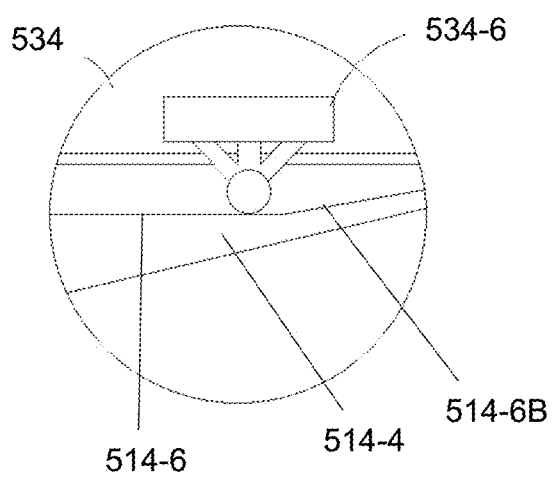
FIG. 6C is a schematic diagram illustrating an exemplary limit unit illustrated in FIG. 6B according to some embodiments of the present disclosure.

In some embodiments, the one or more limit units may be further configured to limit a position of the second shielding cover 534. Merely by way of example, as illustrated in FIGS. 6A and 6B, the guide unit 514-6 may include a sloped structure 514-6A and a sloped structure 514-6B. For each sloped structure, one end of the sloped structure away from the scanner 512 may be higher than another end of the supporting component 514 close to the scanner 512. In such cases, when the second shielding cover 534 moves towards the scanner 512, the limit unit 534-6 may fall with a slope of the sloped structure 514-6A when reaches the sloped structure, and then the second shielding cover 534 may slide towards the scanner 512 under the gravity, thereby achieving a closer contact between the second shielding cover 534 and the shielding layer assembly 520. Additionally, the slopes of the limit unit 534-6 and/or the limit unit 534-8 may prevent the second shielding cover 534 from moving away from the scanner 512, which may also achieve a closer contact between the second shielding cover 534 and the shielding layer assembly 520. In some embodiments, when the second shielding cover 534 moves away from the scanner 512, the limit unit 534-6 may prevent the second shielding cover 534 from being completely separated from the guide unit 514-6, which may improve the operation safety of the imaging system 500. FIG. 6C is a schematic diagram illustrating an exemplary limit unit 534-6 illustrated in FIG. 6B according to some embodiments of the present disclosure. As illustrated in FIG. 6C, when the second shielding cover 534 moves away from the scanner 512, before the second shielding cover 534 is completely separated from the guide unit 514-6, the limit unit 534-6 may be blocked by the sloped structure 514-6B. Correspondingly, a movement of the second shielding cover 534 may be stopped, which may prevent the second shielding cover 534 from falling off the guide unit 514-6, thereby avoiding damages of the second shielding cover 534.

In some embodiments, the second shielding cover 534 may be caused to slide along the guide unit 514-6 in the axial direction by manually operating the second shielding cover 534. For example, as illustrated in FIG. 6A, the second shielding cover 534 may include one or more handles 534-2. An operator may pull the handle 534-2 to open or close the second shielding cover 534. In some embodiments, the second shielding cover 534 may be caused to slide along the guide unit 514-6 in the axial direction semi-automatically or automatically. For example, the imaging system 500 may include a driving assembly (e.g., a driving assembly including a motor and a gear component). The driving assembly may be configured to drive the second shielding cover 534 to move. An operation of the driving assembly may be controlled by a switch such that the second shielding cover 534 may be caused to slide along the guide unit 514-6 in the axial direction semi-automatically. Optionally or additionally, the imaging system 500 may include a control assembly. The control assembly may execute instructions to control the operation of the driving assembly. In such cases, the second shielding cover 534 may be caused to slide along the guide unit 514-6 in the axial direction automatically. The control assembly may be integrated in the imaging system 500 as a portion thereof. Optionally or additionally, the control assembly may be integrated on an external device (e.g., the mobile device 300 illustrated in FIG. 3).

Figure 6D:
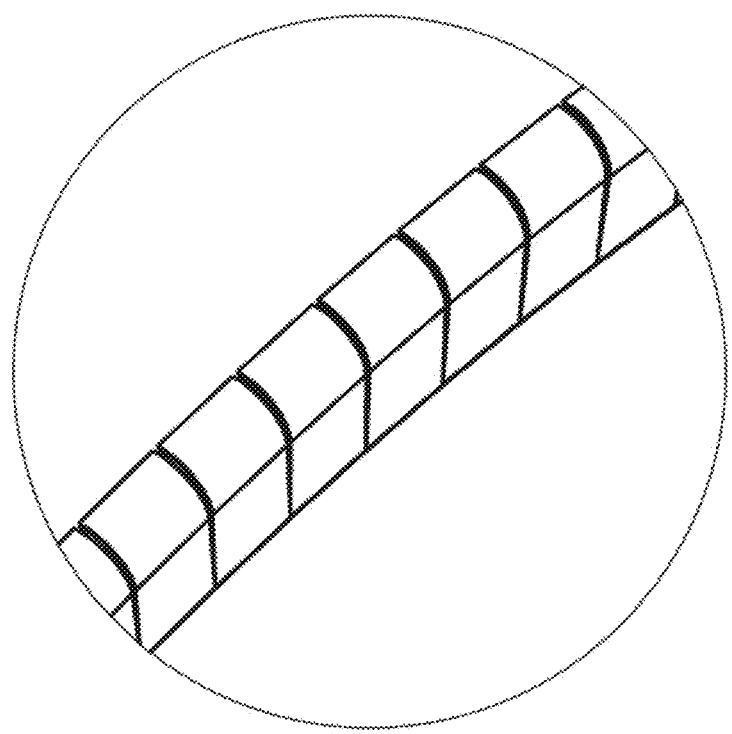
FIG. 6D is a schematic diagram illustrating an enlarged view of a portion of an exemplary connecting component according to some embodiments of the present disclosure.

In some embodiments, as illustrated in FIGS. 6A and 6B, the imaging device 510 may include a connecting component 516. The connecting component 516 may be disposed at the opening of the cavity 512-2 on the second surface 512-6. A shape of the connecting component 516 may be consistent with a shape of an opening 534-4 of the second shielding cover 534. In such cases, the second shielding cover 534 may be coupled to the shielding layer assembly 520 via the connecting component 516. In some embodiments, the connecting component 516 may include an electromagnetic shielding material. In some embodiments, the connecting component 516 may include a mesh structure. For example, the mesh structure of the connecting component 516 may be similar to the mesh structure of the shielding layer assembly 520 or the shielding cover assembly 530. In some embodiments, the connecting component 516 may include a flake structure. FIG. 6D is a schematic diagram illustrating an enlarged view of a portion of an exemplary connecting component according to some embodiments of the present disclosure. As illustrated in FIG. 6D, the connecting component 516 may include a set of leaf springs. Each leaf spring may be connected to two adjacent leaf springs, respectively. In some embodiments, the connecting component 516 may include a flexible structure such that a shape of the connecting component 516 may be adjusted according to the shape of the opening 534-4 of the second shielding cover 534. In some embodiments, the connecting component 516 may be made of an electromagnetic shielding material (e.g., a conductive material, a magnetic material, etc.). In such cases, the second shielding cover 534 may be coupled to the shielding layer assembly 520 via the connecting component 516 electromagnetically.

It should be noted that the example illustrated in FIGS. 6A-6D and the above description thereof are merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. For example, another guide unit may be disposed on the second surface 512-6 in a direction perpendicular to the axial direction of the scanner 512. In such cases, the second shielding cover 534 may be slidable along a direction perpendicular to the axial direction of the scanner 512. When an imaging process is finished or terminated, the second shielding cover 534 may be completely separated from the supporting component 514. As another example, the guide unit 514-6 may be disposed on an upper surface of the first supporting unit 514-2 and the first shielding cover 532 may also be slidable along the guide unit 514-6 in the axial direction of the scanner 512.

In addition, the positions, the shapes, and/or the sizes of components of the imaging system 500 as shown in FIGS. 6A-6D are illustrative, and the components may be mounted at any suitable position and have any suitable size and/or shape. Moreover, a connection between two components (e.g., the second shielding cover 534 and the second supporting unit 514-4) as illustrated in figures and described above may be variable.

Figure 7A:
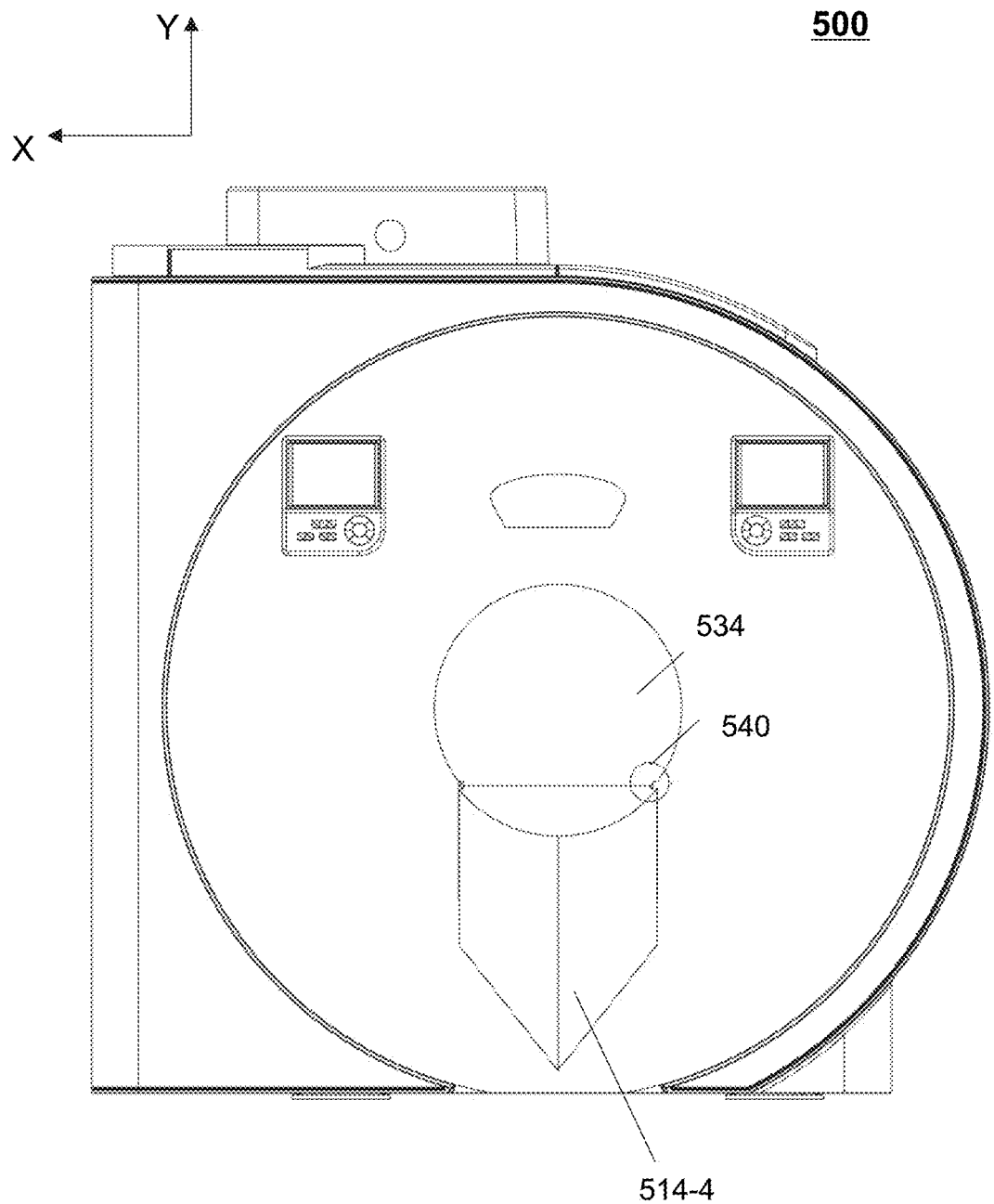
FIG. 7A is a schematic diagram illustrating an exemplary imaging system with a rotatable shielding cover according to some embodiments of the present disclosure.
Figure 7B:
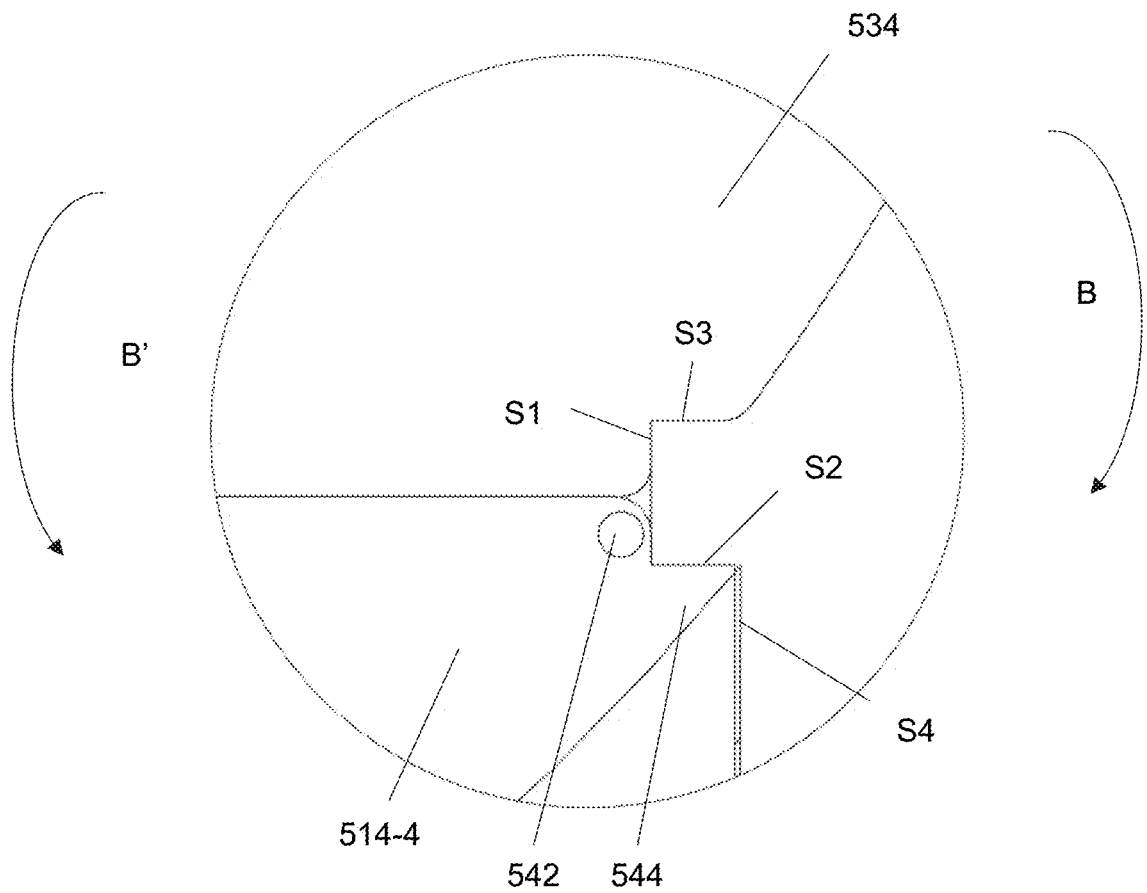
FIG. 7B is a schematic diagram illustrating an exemplary hinged connection according to some embodiments of the present disclosure.
Figure 7C:
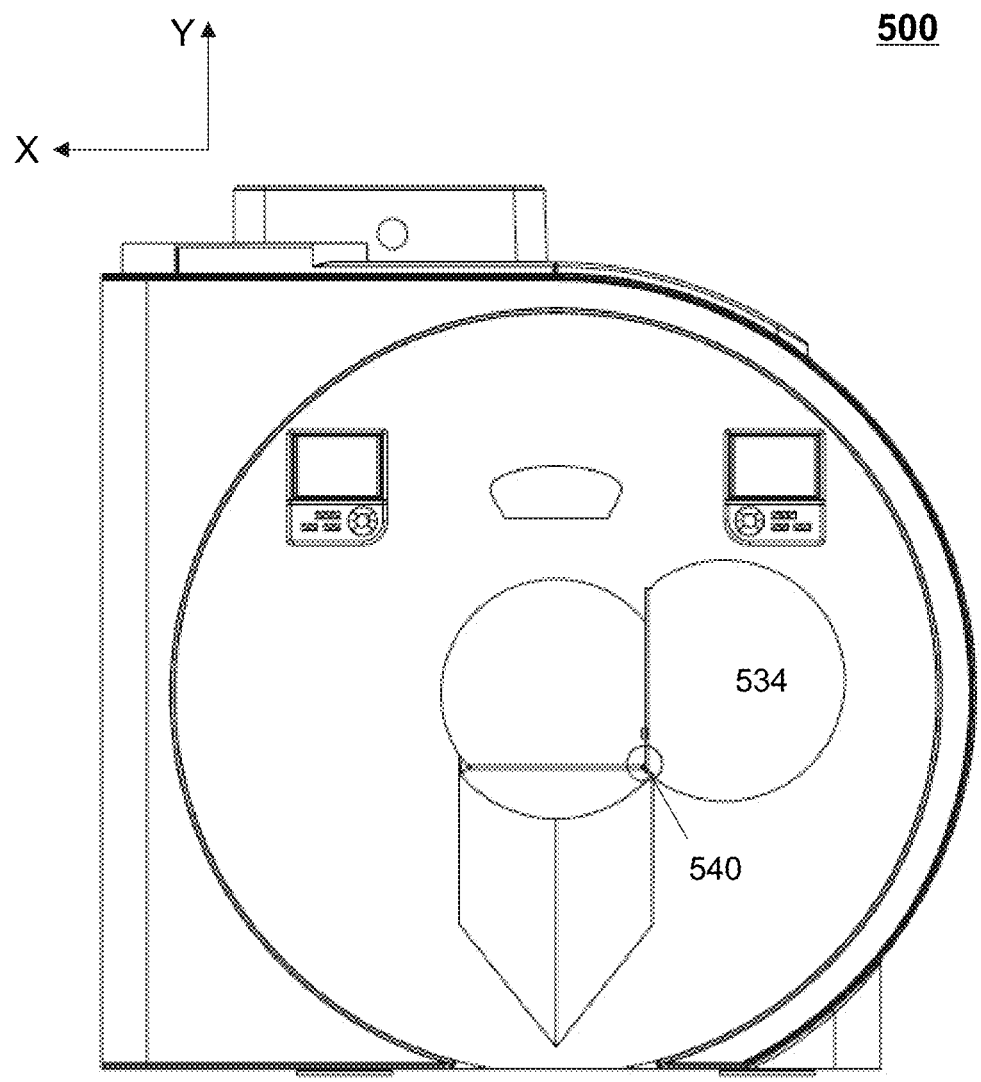
FIG. 7C is a schematic diagram illustrating an exemplary imaging system with a shielding cover in a closed state according to some embodiments of the present disclosure.
Figure 7D:
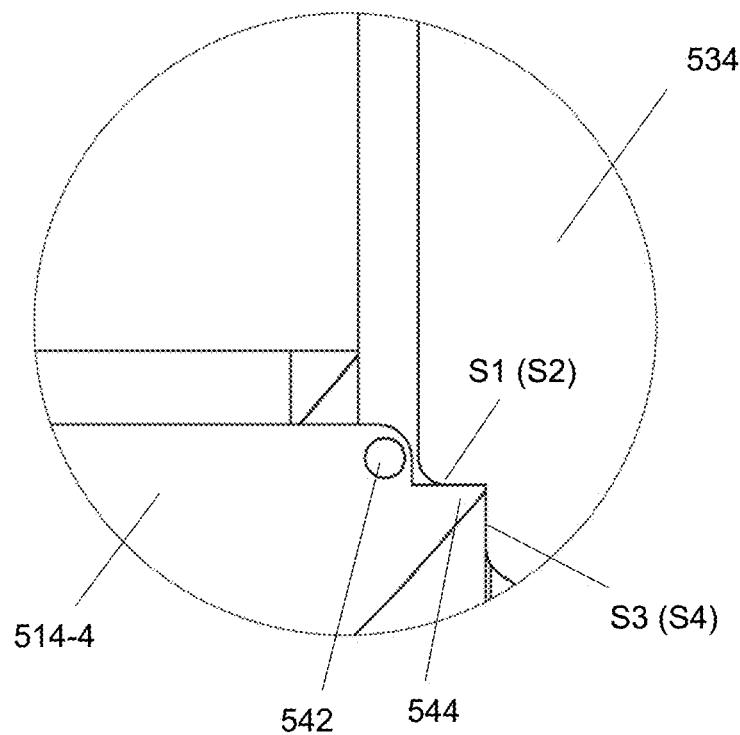
FIG. 7D is a schematic diagram illustrating an exemplary hinged connection in an open state according to some embodiments of the present disclosure.

FIG. 7A is a schematic diagram illustrating an exemplary imaging system 500 with a rotatable shielding cover according to some embodiments of the present disclosure. As illustrated in FIG. 7A, the second shielding cover 534 may include a rotatable structure. At least a portion of the second shielding cover 534 may be coupled to the second supporting unit 514-4 via a hinged connection 540. FIG. 7B is a schematic diagram illustrating an exemplary hinged connection according to some embodiments of the present disclosure. As illustrated in FIG. 7B, the second shielding cover 534 may be coupled to the second supporting unit 514-4 via the hinged connection 540. The hinged connection 540 may include a shaft 542. Merely by way of example, the shaft 542 may be disposed on the second supporting unit 514-4 (e.g., fixedly connected to the second supporting unit 514-4 or integrated with the second supporting unit 514-4). Correspondingly, the second shielding cover 534 may include a connection part (e.g., a hollow cylindrical part, or one or more hollow rings) rotatably matched with the shaft 542. In such cases, the second shielding cover 534 may rotate around the shaft 542. In some embodiments, the second shielding cover 534 may rotate around the shaft 542 in a direction indicated by the arrow B to achieve an open state. The second shielding cover 534 in the open state may further rotate around the shaft 542 in a direction indicated by the arrow B' to achieve a closed state. A rotation angle of the second shielding cover 534 may be in a range from 0 to 270 degrees. In some embodiments, the second supporting unit 514-4 may include a limit part 544. The limit part 544 may be configured to limit the rotation angle of the second shielding cover 534. For example, when the second shielding cover 534 rotates around the shaft 542 in direction B, a first contact surface S1 of the second shielding cover 534 may abut against a second contact surface S2 of the limit part 544. And a third contact surface S3 of the second shielding cover 534 may abut against a fourth contact surface S4 of the limit part 544. In such cases, the rotation angle of the second shielding cover 534 may be limited (e.g., in a range from 0 to 90 degrees). FIG. 7C is a schematic diagram illustrating an exemplary imaging system 500 with a second shielding cover 534 in an open state according to some embodiments of the present disclosure. FIG. 7D is a schematic diagram illustrating an exemplary hinged connection in an open state according to some embodiments of the present disclosure. As illustrated in FIG. 7D, the first contact surface S1 may abut against the second contact surface S2, and the third contact surface S3 may abut against the fourth contact surface S4. In such cases, the rotation of the second shielding cover 534 may be limited, which may prevent the second shielding cover 534 from rotating too fast to cause damages to the second shielding cover 534 or the second supporting unit 514-4.

In some embodiments, the second shielding cover 534 may be caused to rotate around the shaft 542 by manually operating the second shielding cover 534 (e.g., operating one or more handles disposed on the second shielding cover 534). In some embodiments, the second shielding cover 534 may be caused to rotate around the shaft 542 semi-automatically or automatically. For example, the imaging system 500 may include a driving assembly (e.g., a driving assembly including a motor and a gear component). The driving assembly may be configured to drive the second shielding cover 534 to rotate. An operation of the driving assembly may be controlled by a switch such that the second shielding cover 534 may be caused to rotate around the shaft 542 semi-automatically. As another example, the imaging system 500 may include a control assembly. The control assembly may execute instructions to control the operation of the driving assembly. In some embodiments, when the second shielding cover 534 is in the closed state, the second shielding cover 534 may be coupled to the second shielding layer unit 524-4 on the second supporting unit 514-4. For example, the second shielding cover 534 and the second supporting unit 514-4 may be designed such that bottom edges of the second shielding cover 534 may be coupled to upper edges of the second supporting unit 514-4 directly when the second shielding cover 534 is in the closed state. As another example, a perimeter of the bottom edges of the second shielding cover 534 may be slightly larger than a perimeter of the upper edges of the second supporting unit 514-4. In such cases, the upper edges of the second supporting unit 514-4 may be wrapped inside the bottom edges of the second shielding cover 534, thereby forming an effective electromagnetic connection.

Figure 8A:
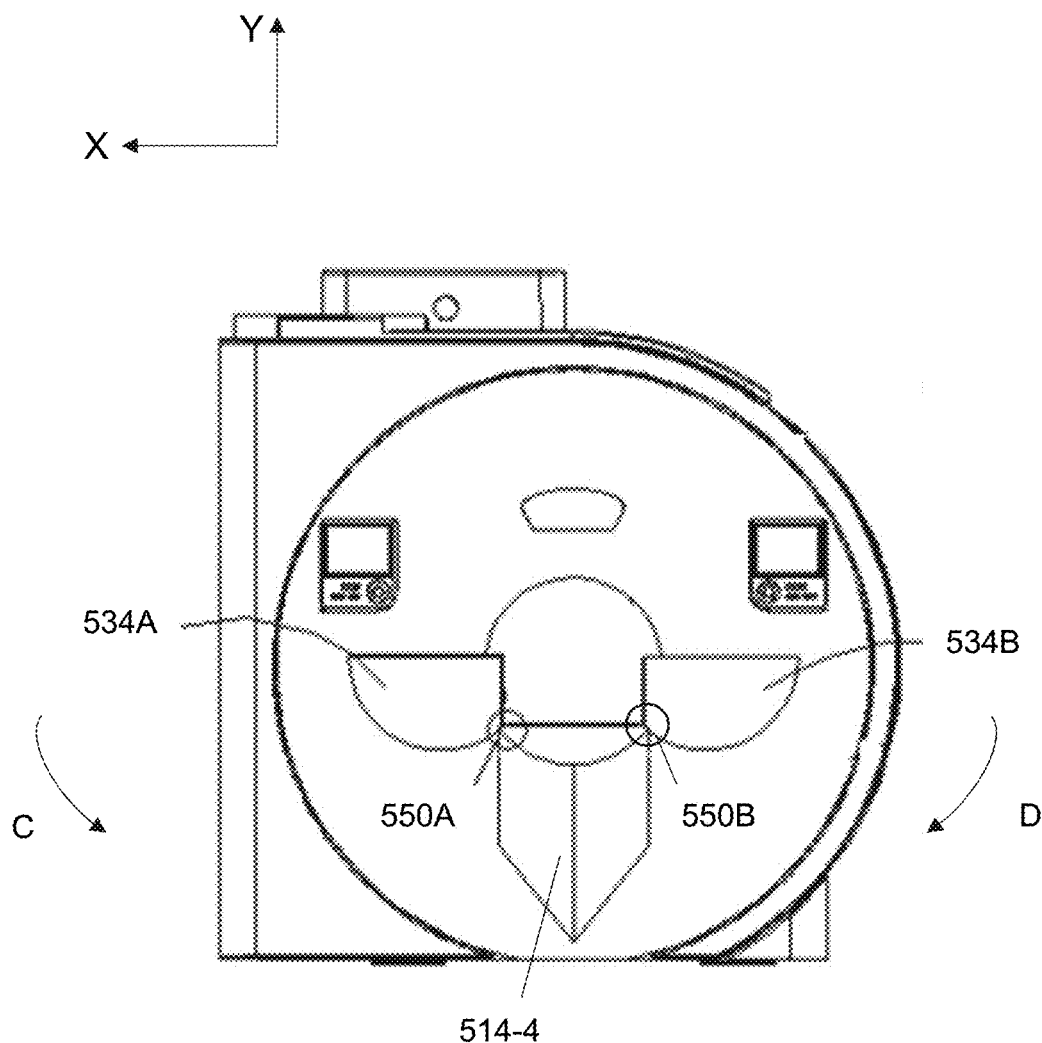
FIGS. 8A and 8B are schematic diagrams illustrating an exemplary imaging system with another rotatable shielding cover according to some embodiments of the present disclosure.
Figure 8B:
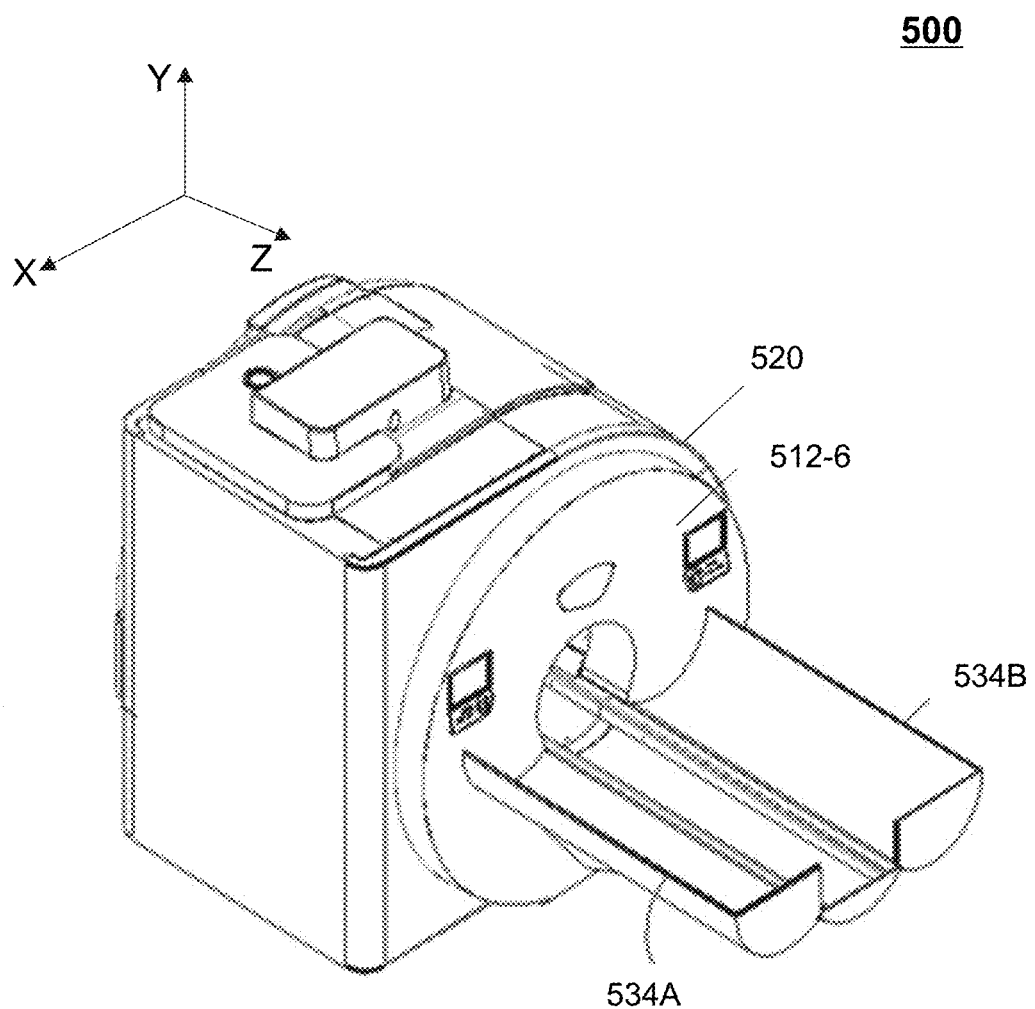

FIGS. 8A and 8B are schematic diagrams illustrating an exemplary imaging system 500 with another rotatable shielding cover according to some embodiments of the present disclosure. As illustrated in FIG. 8A, the second shielding cover 534 may include a first part 534A and a second part 534B. The first part 534A and the second part 534B may be operably coupled to form a complete second shielding cover 534. The first part 534A may be coupled to the second supporting unit 514-4 via a hinged connection 550A. The second part 534B may be coupled to the second supporting unit 514-4 via a hinged connection 550B. In some embodiments, the hinged connection 550A and the hinged connection 550B may be similar to the hinged connection 540 illustrated in FIGS. 7C and 7D. In some embodiments, as illustrated in FIGS. 8A and 8B, when the first part 534A rotates around the hinged connection 550A in a direction indicated by the arrow C and the second part 534B rotates around the hinged connection 550B in the direction indicated by the arrow D, the second shielding cover 534 may be in an open state. Correspondingly, when the first part 534A rotates around the hinged connection 550A in an opposite direction of the direction indicated by the arrow C and the second part 534B rotates around the hinged connection 550B in an opposite direction of the direction indicated by the arrow D, the second shielding cover 534 may be in a closed state. The first part 534A may be coupled to the second part 534B to form a complete second shielding cover 534 (e.g., connected edges of the first part 534A and the second part 534B may include a nestable structure configured to achieve a tight connection), which may be further coupled to the shielding layer assembly 520 on the second surface 512-6. Optionally or additionally, a connection between the first part 534A (and the second part 534B) and the shielding layer assembly 520 may be similar to the connection between the second shielding cover 534 and the shielding layer assembly 520 as illustrated in connection with FIGS. 6A and 6B.

Figure 9A:
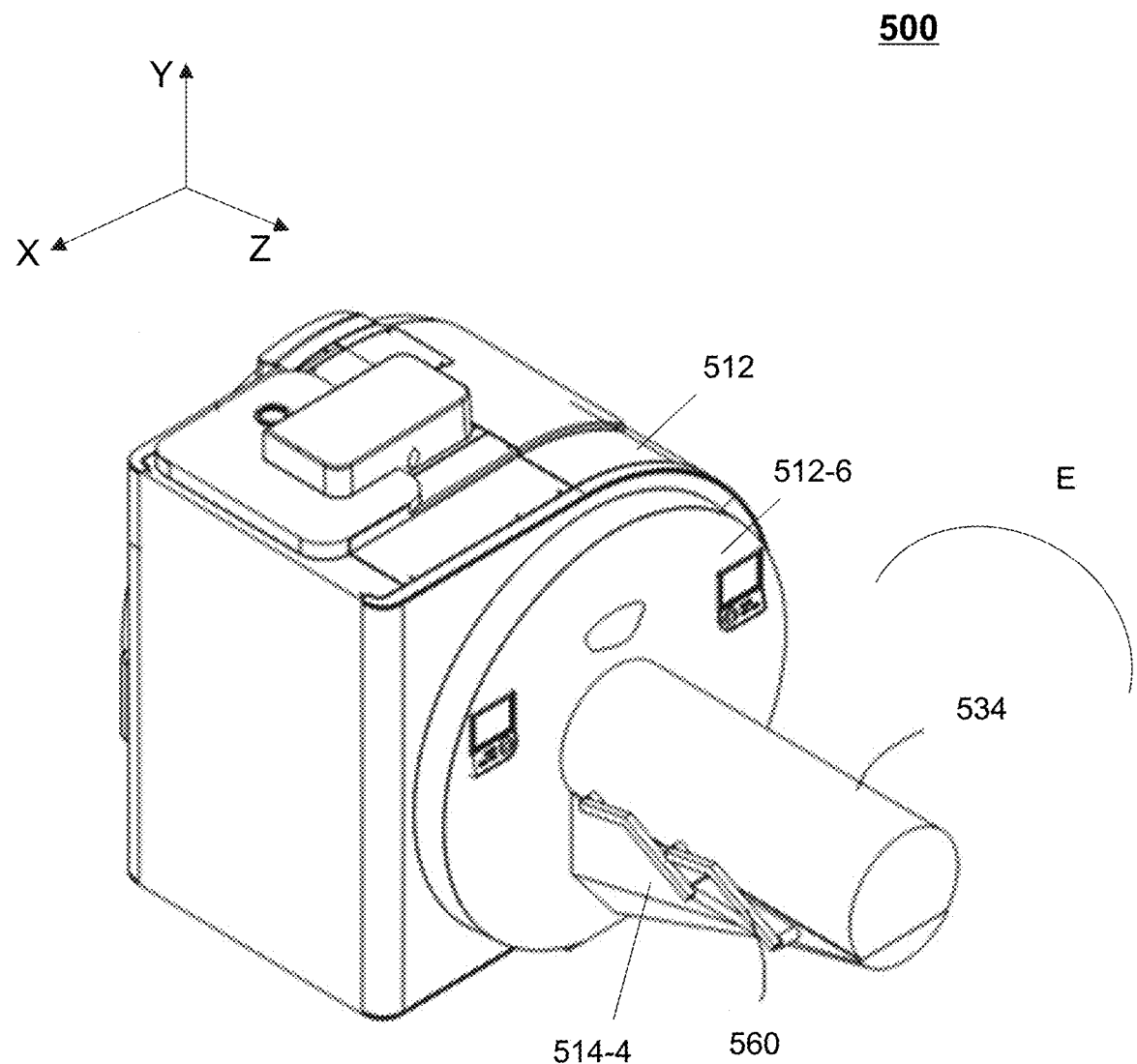
FIGS. 9A and 9B are schematic diagrams illustrating an exemplary imaging system including a rocker assembly according to some embodiments of the present disclosure.
Figure 9B:
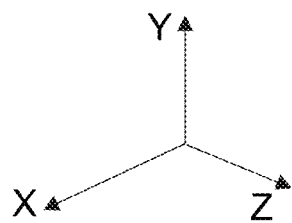
Figure 9B:
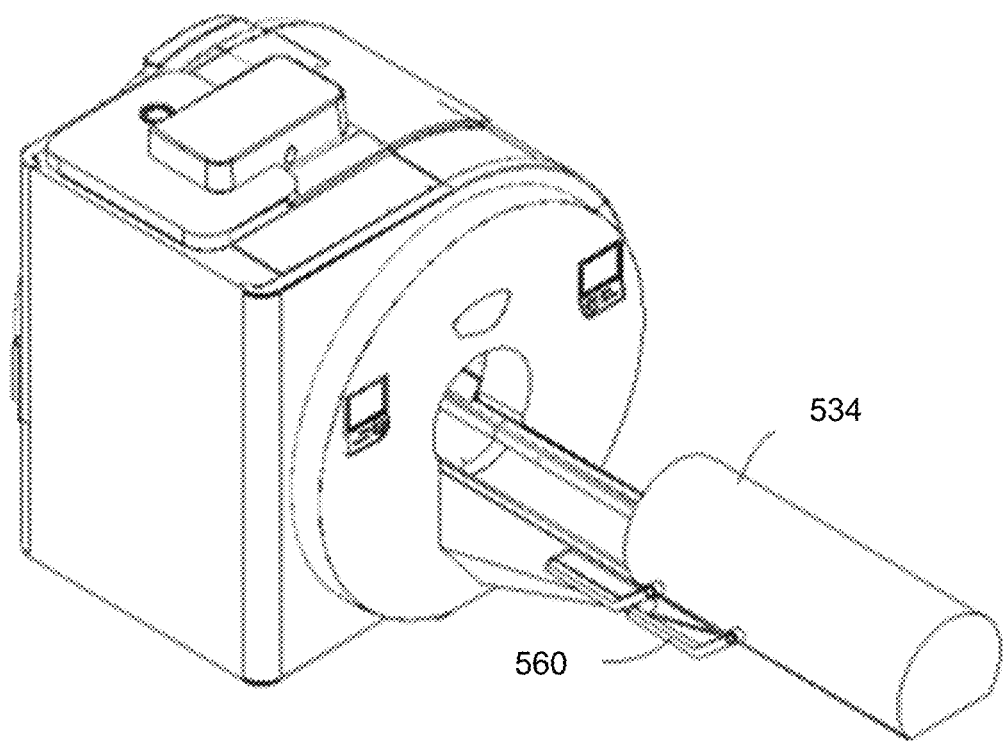

FIGS. 9A and 9B are schematic diagrams illustrating an exemplary imaging system 500 including a rocker assembly 560 according to some embodiments of the present disclosure. As illustrated in FIGS. 9A and 9B, the imaging system 500 may include a rocker assembly 560. A first end of the rocker assembly 560 may be coupled to the second shielding cover 534, and a second end of the rocker assembly 560 may be coupled to the second supporting unit 514-4. In some embodiments, the rocker assembly 560 may include one or more rockers. In some embodiments, the rocker assembly 560 may be operable to control or guide a movement of the second shielding cover 534. For example, as illustrated in FIG. 9A, the first end of a rocker may rotate with respect to the second end of the rocker, and the second shielding cover 534 may move with the first end of the rocker and/or rotate with respect to the first end of the rocker, so that the second shielding cover 534 is caused to move towards the scanner 512. A first trajectory of the second shielding cover 534 may be curved (e.g., a curved line E illustrated in FIG. 9A). Then the second shielding cover 534 may fall on the second supporting unit 514-4 and contact the second surface 512-6 of the scanner 512, thereby achieving a closed state. As another example, as illustrated in FIG. 9B, the second shielding cover 534 may be caused (by the rocker assembly 560) to move away from the scanner 512 in a second trajectory. The second trajectory may be opposite to the first trajectory. The second trajectory may be different from the first trajectory. Then the second shielding cover 534 may fall on the second supporting unit 514-4 and achieve an open state.

It should be noted that the examples illustrated in FIGS. 6A-9B and the above description thereof are merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, the imaging system 500 may include one or more additional components and/or one or more components of the imaging system 500 described above may be omitted. For example, the second shielding cover 534 may be connected to the imaging device 510 via other connection manners to achieve the open state or the closed state.

In addition, the positions, the shapes, and/or the sizes of components of the imaging system 500 as shown in FIGS. 6A-9B are illustrative, and the components may be mounted at any suitable position and have any suitable size and/or shape. Moreover, a connection between two components (e.g., the first part 534A and the second part 534B) as illustrated in figures and described above may be variable.

Figure 10:
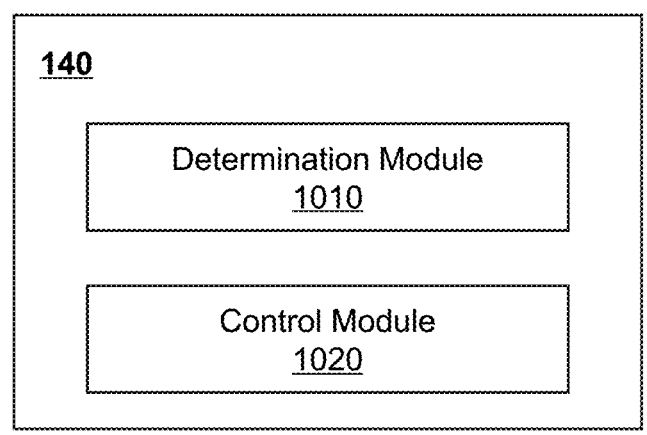
FIG. 10 is a block diagram illustrating an exemplary processing device according to some embodiments of the present disclosure.

FIG. 10 is a block diagram illustrating an exemplary processing device 140 according to some embodiments of the present disclosure. The processing device 140 may include a determination module 1010, and a control module 1020.

The determination module 1010 may be configured to determine a current position for at least one portion of a shielding cover assembly of an imaging system. In some embodiments, the imaging system (e.g., the imaging system 500) may include an imaging device (e.g., the imaging device 510), a shielding layer assembly (e.g., the shielding layer assembly 520 illustrated in FIGS. 5A and 5B) disposed on at least a first portion of the imaging device. In some embodiments, the shielding cover assembly may be disposed on at least a second portion of the imaging device. In some embodiments, to determine the current position for the at least one portion of the shielding cover assembly, the determination module 1010 may be configured to obtain mechanical parameters from the imaging device. Further, the determination module 1010 may be configured to determine the current position based on the mechanical parameters. In some embodiments, to determine the current position for the at least one portion of the shielding cover assembly, the determination module 1010 may be configured to may obtain an image of the at least one portion of the shielding cover assembly (e.g., via an image sensor of the imaging system or from an external device). Further, the determination module 1010 may be configured to determine the current position based on the image (e.g., using an image processing technology).

The control module 1020 may be configured to cause a driving device to drive the at least one portion of the shielding cover assembly to move from the current position to a target position. The target position may include a position at which the shielding cover assembly is in a closed state (or an open state). When the at least one portion of the shielding cover assembly moves to the target position, the shielding cover assembly may be coupled to the shielding layer assembly to shield the imaging device from an EMI. In some embodiments, the control module 1020 may be configured to determine movement parameters (e.g., a movement direction, a movement speed, a movement distance, etc.) of the at least one portion of the shielding cover assembly based on mechanical parameters relating to the current position and the target position. Further, the control module 1020 may be configured to cause a driving device to drive the at least one portion of the shielding cover assembly to move based on the movement parameters.

In some embodiments, to cause the driving device to drive the at least one portion of the shielding cover assembly to move from the current position to the target position, the control module 1020 may be configured to determine an operating state of the imaging device (e.g., according to operation information of the imaging device). Further, the according to operation information of the imaging device cause the driving device to drive the at least one portion of the shielding cover assembly to move from the current position to the target position based at least in part on the operating state of the imaging device. For example, the operating state may be a scanning preparation state in which the imaging device is preparing to image a subject. Then the control module 1020 may determine to cause the driving device to drive the at least one portion of the shielding cover assembly to move from the current position to the target position such that the shielding cover assembly may be coupled to the shielding layer assembly to shield the imaging device from an EMI. In some embodiments, when the shielding cover assembly is coupled to the shielding layer assembly, the shielding cover assembly and the shielding layer assembly may be combined to form a shielding space. The shielding cover assembly and the shielding layer assembly may be configured to shield the shielding space against electromagnetic waves from an outside of the shielding space, thereby shielding the imaging device from an EMI.

It should be noted that the above descriptions of the processing device 140 are provided for the purposes of illustration, and not intended to limit the scope of the present disclosure. For persons having ordinary skills in the art, various modifications and changes in the forms and details of the application of the above method and system may occur without departing from the principles of the present disclosure. However, those variations and modifications also fall within the scope of the present disclosure. In some embodiments, the processing device 140 may include one or more other modules. For example, the processing device 140 may include a storage module to store data generated by the modules in the processing device 140.

Figure 11:
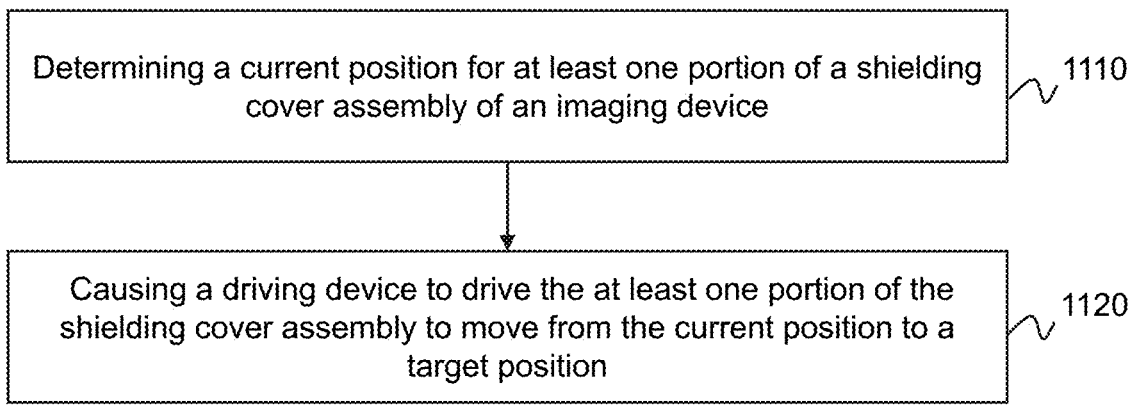
FIG. 11 is a flowchart illustrating an exemplary process for controlling an imaging device according to some embodiments of the present disclosure.

FIG. 11 is a flowchart illustrating an exemplary process for controlling an imaging device according to some embodiments of the present disclosure. In some embodiments, at least part of process 1100 may be performed by the processing device 140 (implemented in, for example, the computing device 200 shown in FIG. 2). For example, the process 1100 may be stored in a storage device (e.g., the storage device 150, the storage 220, the storage 390) in the form of instructions (e.g., an application), and invoked and/or executed by the processing device 140 (e.g., the processor 210 illustrated in FIG. 2, the CPU 340 illustrated in FIG. 3, one or more modules illustrated in FIG. 10). The operations of the illustrated process presented below are intended to be illustrative. In some embodiments, the process 1100 may be accomplished with one or more additional operations not described, and/or without one or more of the operations discussed. Additionally, the order in which the operations of the process 1100 as illustrated in FIG. 11 and described below is not intended to be limiting.

In 1110, the processing device 140 (e.g., the determination module 1010) may determine a current position for at least one portion of a shielding cover assembly of an imaging system. In some embodiments, the imaging system (e.g., the imaging system 500) may include an imaging device (e.g., the imaging device 510), a shielding layer assembly (e.g., the shielding layer assembly 520 illustrated in FIGS. 5A and 5B) disposed on at least a first portion of the imaging device. For example, the imaging system may be or include a scanner (e.g., the MRI scanner 110 illustrated in FIG. 1) and a supporting component (e.g., the supporting component 514 illustrated in FIGS. 5A and 5B) configured to support a table. The shielding layer assembly may include a first shielding layer disposed on the scanner and a second shielding layer disposed on the supporting component. In some embodiments, the shielding cover assembly may be disposed on at least a second portion of the imaging device. For example, the shielding cover assembly may be disposed on the supporting component and may be coupled to the shielding layer assembly. In some embodiments, the at least one portion (e.g., the second shielding cover 534) of the shielding cover assembly may be moveable or detachable.

In some embodiments, to determine the current position for the at least one portion of the shielding cover assembly, the processing device 140 may obtain mechanical parameters from the imaging device. Further, the processing device 140 may determine the current position based on the mechanical parameters. In some embodiments, to determine the current position for the at least one portion of the shielding cover assembly, the processing device 140 may obtain an image of the at least one portion of the shielding cover assembly (e.g., via an image sensor of the imaging system or from an external device). Further, the processing device 140 may determine the current position based on the image (e.g., using an image processing technology).

In 1120, the processing device 140 (e.g., the control module 1020) may cause a driving device to drive the at least one portion of the shielding cover assembly to move from the current position to a target position. The target position may include a position at which the shielding cover assembly is in a closed state. When the at least one portion of the shielding cover assembly moves to the target position, the shielding cover assembly may be coupled to the shielding layer assembly to shield the imaging device from an EMI. Optionally or additionally, the target position may include a position at which the shielding cover assembly is in an open state. For example, the current position may include the position at which the shielding cover assembly is in the closed state. An imaging process may be finished or terminated when the shielding cover assembly is at the current position. Correspondingly, the target position may include position at which the shielding cover assembly is in the open state to facilitate a subject to leave the table. In some embodiments, the processing device 140 may determine movement parameters (e.g., a movement direction, a movement speed, a movement distance, etc.) of the at least one portion of the shielding cover assembly based on mechanical parameters relating to the current position and the target position. Further, the processing device 140 may cause a driving device to drive the at least one portion of the shielding cover assembly to move based on the movement parameters. For example, the driving device may include a rotatable gear component to drive the at least one portion of the shielding cover assembly to move, and a motor to drive the gear component to rotate. The processing device 140 may generate a control signal to control an operation of the motor so as to drive the at least one portion of the shielding cover assembly to move to the target position.

In some embodiments, to cause the driving device to drive the at least one portion of the shielding cover assembly to move from the current position to the target position, the processing device 140 may determine an operating state of the imaging device. In some embodiments, the processing device 140 may determine the operating state according to operation information of the imaging device. Further, the processing device 140 may cause the driving device to drive the at least one portion of the shielding cover assembly to move from the current position to the target position based at least in part on the operating state of the imaging device. For example, the operating state may be a scanning preparation state in which the imaging device is preparing to image a subject. Then the processing device 140 may determine to cause the driving device to drive the at least one portion of the shielding cover assembly to move from the current position to the target position such that the shielding cover assembly may be coupled to the shielding layer assembly to shield the imaging device from an EMI.

It should be noted that the above description of the process 1100 is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. In some embodiments, one or more operations of the process 1100 may be added or omitted. For example, the process 1100 may include an operation in which the processing device may determine a second target position for the at least one portion of the shielding cover assembly and cause the driving device to drive the at least one portion of the shielding cover assembly to move to the second target position. The second target position may include a position at which the shielding cover assembly is in an open state. When the at least one portion of the shielding cover assembly moves to the second target position, the subject imaged by the imaging device may leave the table from the opened at least one portion of the shielding cover assembly.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

Having thus described the basic concepts, it may be rather apparent to those skilled in the art after reading this detailed disclosure that the foregoing detailed disclosure is intended to be presented by way of example only and is not limiting.

Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this disclosure are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction performing system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB. NET, Python or the like, conventional procedural programming languages, such as the "C" programming language, Visual Basic, Fortran 2103, Perl, COBOL 2102, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities or properties used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

We claim:

1. A system, comprising:
   an imaging device;
   a shielding layer assembly disposed on at least a first portion of the imaging device, wherein the first portion includes a scanner including a bore, and the shielding layer assembly includes a first shielding layer disposed on a shell of the scanner; and
   a shielding cover assembly disposed on at least a second portion of the imaging device; and
   a controller configured to cause a driving device to drive at least one portion of the shielding cover assembly to move from a current position to a target position,
   wherein the shielding cover assembly includes a mesh structure, and when the shielding cover assembly is coupled to the shielding layer assembly,
   wherein in the target position, the shielding cover assembly and the shielding layer assembly are combined to form an electromagnetically closed shielding space that is shielded against electromagnetic waves from an outside of the shielding space, and
   the bore, the shielding cover assembly and the shielding layer assembly form a closed cavity in which a table of the imaging device is allowed to move along an axial direction of the scanner so as to move in or out of the bore.

2. The system of claim 1, wherein
   the first shielding layer is disposed on at least a portion of a peripheral surface of the bore.

3. The system of claim 1 wherein
   the scanner includes a radio frequency coil component, a gradient coil component, and a main magnet component; and
   the first shielding layer is disposed on at least a portion of the main magnet component.

4. The system of claim 1, wherein
   the second portion of the imaging device includes a supporting component configured to support the table; and
   the shielding layer assembly includes a second shielding layer disposed on at least a portion of the supporting component.

5. The system of claim 4, wherein
   the scanner includes a first surface and a second surface disposed opposite to each other in an axial direction of the scanner; and
   the supporting component includes a first supporting unit connected to a first portion of the scanner on a side of the first surface or a second supporting unit connected to a second portion of the scanner on a side of the second surface of the scanner.

6. The system of claim 5, wherein the second shielding layer includes
   a first portion of the second shielding layer including a first shielding layer unit disposed on at least a portion of the first supporting unit, or
   a second portion of the second shielding layer including a second shielding layer unit disposed on at least a portion of the second supporting unit.

7. The system of claim 4, wherein the shielding cover assembly includes a first shielding cover coupled to the first shielding layer and at least a first portion of the second shielding layer.

8. The system of claim 7, wherein the shielding cover assembly further includes a second shielding cover coupled to the first shielding layer and at least a second portion of the second shielding layer.

9. The system of claim 8, wherein the first shielding cover or the second shielding cover is moveable or detachable.

10. The system of claim 9, wherein
    the supporting component includes a guide unit; and
    the second shielding cover is slidable along the guide unit in an axial direction of the scanner.

11. The system of claim 10, wherein the driving device is configured to drive the second shielding cover to slide along the guide unit in the axial direction of the scanner.

12. The system of claim 9, further comprising a rocker assembly operable to control a movement of the second shielding cover, wherein one end of the rocker assembly is coupled to the second shielding cover and another end of the rocker assembly is coupled to the supporting component.

13. The system of claim 9, wherein the second shielding cover is slidable along a direction perpendicular to an axial direction of the scanner.

14. The system of claim 8, wherein the first shielding cover or the second shielding cover includes a rotatable structure.

15. The system of claim 14, wherein at least a portion of the second shielding cover is coupled to the supporting component via a hinged connection.

16. The system of claim 1, wherein the shielding layer assembly includes a mesh structure.

17. A method implemented on a computing device having one or more processors and one or more storage devices, the method comprising:
    determining a current position for at least one portion of a shielding cover assembly of an imaging device, wherein the shielding cover assembly includes a mesh structure, and the imaging device includes a shielding layer assembly disposed on a scanners of the imaging device, the scanner including a bore, and the shielding layer assembly including a first shielding layer disposed on a shell of the scanner; and
    causing a driving device to drive the at least one portion of the shielding cover assembly to move from the current position to a target position, wherein
    when the at least one portion of the shielding cover assembly moves to the target position, the shielding cover assembly is coupled to the shielding layer assembly to form an electromagnetically closed shielding space that is shielded against electromagnetic waves from an outside of the shielding space, and
    the bore, the shielding cover assembly and the shielding layer assembly form a closed cavity in which a table of the imaging device is allowed to move along an axial direction of the scanner so as to move in or out of the bore.

18. The method of claim 17, wherein the causing the driving device to drive the at least one portion of the shielding cover assembly to move from the current position to a target position includes:
    determining an operating state of the imaging device; and causing the driving device to drive the at least one portion of the shielding cover assembly to move from the current position to the target position based at least in part on the operating state.

\* \* \* \* \*